(12) United States Patent
Cometti et al.

(10) Patent No.: US 8,644,099 B2
(45) Date of Patent: Feb. 4, 2014

(54) APPARATUS AND METHOD FOR DETERMINING A READ LEVEL OF A FLASH MEMORY AFTER AN INACTIVE PERIOD OF TIME

(75) Inventors: Aldo G. Cometti, San Diego, CA (US); Lun Bin Huang, San Diego, CA (US); Ashot Melik-Martirosian, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 114 days.

(21) Appl. No.: 13/179,466

(22) Filed: Jul. 8, 2011

(65) Prior Publication Data

US 2012/0239976 A1    Sep. 20, 2012

Related U.S. Application Data

(60) Provisional application No. 61/363,157, filed on Jul. 9, 2010.

(51) Int. Cl.
*G11C 7/00* (2006.01)
(52) U.S. Cl.
USPC ................... 365/201; 365/185.18; 365/226
(58) Field of Classification Search
USPC .................. 365/201, 185.18, 226, 185.03
See application file for complete search history.

(56) References Cited

U.S. PATENT DOCUMENTS

| | | | |
|---|---|---|---|
| 7,613,045 B2 * | 11/2009 | Murin et al. ............... | 365/185.2 |
| 7,656,707 B2 | 2/2010 | Kozlov | |
| 8,072,805 B2 | 12/2011 | Chou et al. | |
| 8,315,092 B2 * | 11/2012 | Strasser et al. ........... | 365/185.03 |
| 2009/0259916 A1 | 10/2009 | Hsu et al. | |
| 2010/0118608 A1 | 5/2010 | Song et al. | |
| 2010/0180073 A1 | 7/2010 | Weingarten et al. | |
| 2011/0167305 A1 | 7/2011 | Haratsch et al. | |
| 2011/0219203 A1 | 9/2011 | Nurminen et al. | |

\* cited by examiner

*Primary Examiner* — Huan Hoang
(74) *Attorney, Agent, or Firm* — McDermott Will & Emery LLP

(57) ABSTRACT

Disclosed is an apparatus and method for determining a dwell time in a non-volatile memory circuit after a shutdown of the memory circuit. A voltage shift is calculated by comparing a first read level voltage required to read a test block stored before the shutdown and a second read level voltage required to read a second test block stored after the shutdown. A shutdown time is determined from a look up table indexed by the voltage shift and a number of program/erase cycles. The dwell time is calculated as a function of the drive temperature, a clock, and a block time stamp. Once the dwell time is calculated, a controller calculates a new read level voltage based, in part, on the dwell time and provides one or more programming commands representative of the new read level voltage to the memory circuit to read the memory circuit.

23 Claims, 18 Drawing Sheets

APPARATUS AND METHOD FOR DETERMINING A READ LEVEL OF A FLASH MEMORY AFTER AN INACTIVE PERIOD OF TIME

This application claims the benefit of U.S. Provisional Application No. 61/363,157, filed on Jul. 9, 2010, which is hereby incorporated by reference herein.

TECHNICAL FIELD

The subject technology relates generally to memory devices and in particular multi-level cell flash memory devices.

BACKGROUND

Flash memory bears little resemblance to a magnetic recording system. Commodity flash chips are closed systems with no external access to analog signals, in sharp contrast to the typical Hard Disk Drive (HDD) where analog signals have always been available for study. Even though the HDD is a complex electro-mechanical system and can suffer catastrophic failure, it has been possible to engineer drives to have a life expectancy with little to no degradation in performance, which extend beyond their time of technical obsolescence. The performance of flash memory, on the other hand, is known to degrade through the life cycle and has a finite life. Consequently, since flash memory was first conceived as a memory device the target error rate at the output of the chip has been very low, as opposed to systems where stronger Error Correction Coding (ECC) may be used.

Lower priced Solid State Drives (SSD) are typically manufactured using multi-level cell (MLC) flash memory for increased data capacity, but MLC is less reliable than single-level cell (SLC) flash memory. Consumer SSD manufacturers have mitigated such problems by employing interleaving and/or providing excess capacity in conjunction with wear-leveling algorithms. MLC flash endurance, however, has not been proven acceptable for enterprise SSD applications. Even with the increased data capacity of MLC, it becomes more expensive in enterprise applications because of its disproportionately large decrease in program/erase (P/E) cycles over time due to increased (wear causing) stresses required to read, program and erase the flash, causing a gradual degradation in endurance.

SUMMARY

A method for determining a dwell time in a memory circuit after a shutdown of the memory circuit is disclosed. In one aspect, the method includes storing a first test block before the shutdown, storing a second test block after powering on the memory circuit, performing a first read level sweep of the first test block to determine a first read level voltage with minimum errors, including determining (for example, calculating) the first read level voltage as a function of a nominal read level voltage and a first estimation parameter, performing a second read level sweep of the second test block to determine a second read level voltage with minimum errors, including determining the second read level voltage as a function of the nominal read level voltage and a second estimation parameter, determining a shutdown $V_T$ shift as a function of the first read level voltage and the second read level voltage, and determining a shutdown duration as a function of the shutdown $V_T$ shift.

Also disclosed is a control circuit for determining a dwell time in a memory circuit after a shutdown of the memory circuit. In one aspect, the control circuit includes a memory interface configured to be operably coupled to the memory circuit, and a controller. The controller of the control circuit may be configured to store a first test block before the shutdown, save a second test block after the memory circuit is powered on, perform a first read level sweep of the first test block to determine a first read level voltage with minimum errors, including determining the first read level voltage as a function of a nominal read level voltage and a first estimation parameter, perform a second read level sweep of the second test block to determine a second read level voltage with minimum errors, including determining the second read level voltage as a function of the nominal read level voltage and a second estimation parameter, calculate a shutdown $V_T$ shift as a function of the first read level voltage and the second read level voltage, and calculate a shutdown duration as a function of the shutdown $V_T$ shift.

Also disclosed is a system for determining a dwell time in a memory circuit after a shutdown of the memory circuit. In one aspect, the system includes a host interface configured to be operably coupled to a host device, to receive data from the host device, and to send data to the host device, a temperature sensor, a storage medium interface operably coupled to a volatile memory, a memory interface operably coupled to the memory circuit, and a controller. The controller of the system may be operable to store a first test block before the shutdown, save a second test block after the memory circuit is powered on, perform a first read level sweep of the first test block to determine a first read level voltage with minimum errors, including determining the first read level voltage as a function of a nominal read level voltage and a first estimation parameter, perform a second read level sweep of the second test block to determine a second read level voltage with minimum errors, including determining the second read level voltage as a function of the nominal read level voltage and a second estimation parameter, calculate a shutdown $V_T$ shift as a function of the first read level voltage and the second read level voltage, and calculate a shutdown duration as a function of the shutdown $V_T$ shift.

In some aspects, the method, control circuit, and/or system may include the controller storing a pre-shutdown temperature before the shutdown and determining the dwell time as a function of the current time and the block time stamp and the revised duration may include retrieving a pre-shutdown temperature and the block time stamp, determining a temperature acceleration factor as a function of the drive temperature and the pre-shutdown temperature, and determining the dwell time as a function of the current time, the block time stamp, the revised duration, and the temperature acceleration factor. In other aspects, the method, control circuit, and/or system may include determining a temperature acceleration factor as a function of a drive temperature, determining a current aging time as a function of a current time value and the temperature acceleration factor, determining an post-shutdown aging time as a function of the current aging time and the shutdown duration, reading a block time stamp, and determining the dwell time by subtracting the block time stamp from the post-shutdown aging time.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
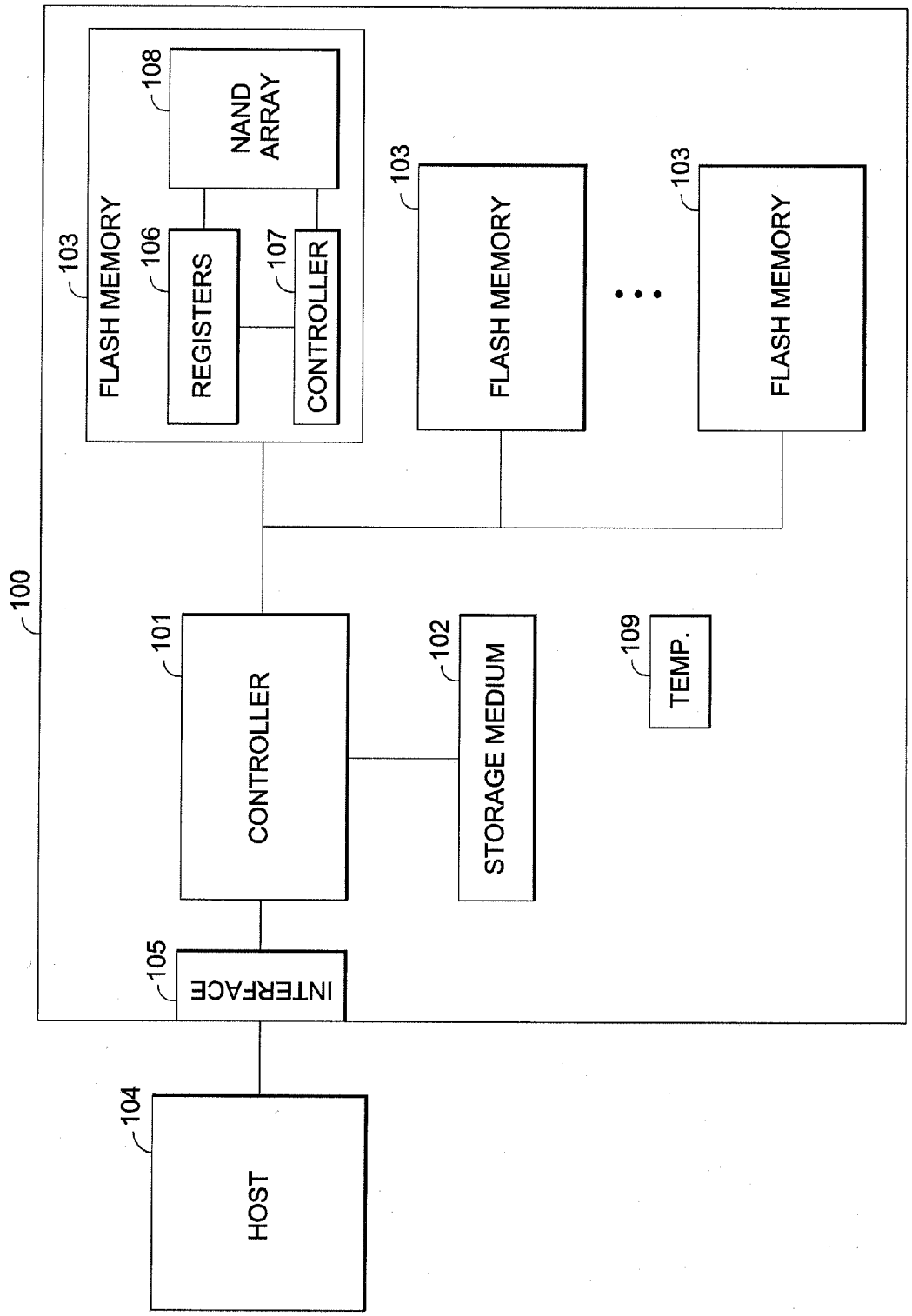
FIG. 1 is a block diagram illustrating components of a data storage system according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In a flash memory device, for example, with NAND architecture, memory cells are grouped in strings, with each string consisting of a set of transistors connected in series between a drain select transistor, connected to a bit line of the memory block, and a source select transistor, connected to a reference voltage distribution line. Each memory cell includes a floating-gate MOS transistor. When programming a memory cell, electrons are injected into the floating-gate, for example, by means of Fowler-Nordheim (F-N) Tunneling and/or hot-electron injection. The non-volatility of the cell is due to the electrons maintained within the floating-gate. Bits are stored by trapping charge on the floating gate (an electrically isolated conductor) which stores a logic value defined by its threshold voltage (read threshold) commensurate with the electric charge stored. When the cell is erased, the electrons in the floating gate are pulled off by quantum tunneling (a tunnel current) from the floating gate to, for example, the source and/or substrate.

As a flash memory is cycled (that is, programmed and erased repeatedly), its physical qualities change. For example, the repeated placement and removal of electrons on the floating gate during programming and erase operations, respectively, causes some excess electrons to be trapped in the device. Also, when one or multiple cells are programmed, adjacent cells may experience an unexpected and undesired charge injection to their floating gates, thus leading to corruption of data stored therein. For instance, electrons may leak into neighboring cells after prolonged stress due to the voltages at the gates of neighboring cells. The threshold voltages of these memory cells may eventually take values that are different (higher or lower) than expected values, causing errors when the data is read. Generally, the damage done becomes a function of the field strength (voltage) and duration; that is, programming the flash memory to high threshold voltage conditions increases the rate of damage arising from both program and erase processes because it requires longer duration and/or higher applied fields. For instance, adding enough electrons can change a cell from an erased state to a programmed state.

In NAND architecture, it has been found that the problem of degradation is especially problematic because each transistor in the string of the cells being read receives an elevated voltage stress. Read retry capability has been introduced to perform data re-read when read errors exceed error correction capability, however, read performances are only further degraded by the number of read retries performed. Endurance has been sacrificed to meet the requirements of mainstream consumer flash application which are low cost (maximum bits in each cell), long retention time (for example, extended dwell time), fast programming/erase, and low error rate to work with unsophisticated controllers. Contrary to industry practice, the subject technology provides a system and process for use in flash memory cell architectures that uses prediction and estimation of read levels to reduce the number of read retries, thereby improving the reliability and endurance of flash memory making it suitable for enterprise applications.

FIG. 1 is a block diagram illustrating components of a data storage system according to one aspect of the subject technology. As depicted in FIG. 1, in some aspects, data storage system 100 (for example, a solid state drive) includes data storage controller 101, storage medium 102, and flash memory 103. Controller 101 may use storage medium 102 for temporary storage of data and information used to manage data storage system 100. Controller 101 may include several internal components such as a read-only memory, a flash component interface (for example, a multiplexer to manage instruction and data transport along a serial connection to flash memory 103), an I/O interface, error correction circuitry, and the like. In some aspects, all of these elements of controller 101 may be integrated into a single chip. In other aspects, these elements may be separated on their own PC board.

Controller 101 may also include a processor that may be configured to execute code or instructions to perform the operations and functionality described herein, manage request flow and address mappings, and to perform calculations and generate commands. The processor of controller 101 may be configured to monitor and/or control the operation of the components in data storage controller 101. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 101 and/or its processor. One or more sequences of instructions may be software stored and read from storage medium 102, flash memory 103, or received from host device 104 (for example, via host interface 105). ROM, storage medium 102, flash memory 103, represent examples of machine or computer readable media on which instructions/code executable by controller 101 and/or its processor may be stored. Machine or computer readable media may generally refer to any medium or media used to provide instructions to controller 101 and/or its processor, including volatile media, such as dynamic memory used for storage media 102 or for buffers within controller 101, and non-volatile media, such as electronic media, optical media, and magnetic media.

In some aspects, controller 101 may be configured to store data received from a host device 104 in flash memory 103 in response to a write command from host device 104. Controller 101 may be further configured to read data stored in flash memory 103 and to transfer the read data to host device 104 in response to a read command from host device 104. As will be described in more detail below, controller 101 may also be configured to determine a dwell time in a non-volatile memory circuit after a shutdown of the memory circuit as a function of the time and temperature of the inactive period, and to estimate the proper read levels needed to read a memory cell in view of changed memory conditions due to the dwell time after startup of the system. By dynamically adjusting read levels of the flash memory 103, the subject technology may extend the number of P/E operations that may be performed on memory cells within flash memory 103 in a particular application environment, and increase the endurance of the memory cells compared to the same application environment operating without the ability to dynamically adjust read levels.

Host device 104 represents any device configured to be coupled to data storage system 100 and to store data in data storage system 100. Host device 104 may be a computing system such as a personal computer, a server, a workstation, a laptop computer, PDA, smart phone, and the like. Alternatively, host device 104 may be an electronic device such as a digital camera, a digital audio player, a digital video recorder, and the like.

In some aspects, storage medium 102 represents volatile memory used to temporarily store data and information used to manage data storage system 100. According to one aspect of the subject technology, storage medium 102 is random access memory (RAM) such as double data rate (DDR) RAM. Other types of RAM also may be used to implement storage medium 102. Memory 102 may be implemented using a single RAM module or multiple RAM modules. While storage medium 102 is depicted as being distinct from controller 101, those skilled in the art will recognize that storage medium 102 may be incorporated into controller 101 without departing from the scope of the subject technology. Alternatively, storage medium 102 may be a non-volatile memory such as a magnetic disk, flash memory, peripheral SSD, and the like.

As further depicted in FIG. 1, data storage system 100 may also include host interface 105. Host interface 105 may be configured to be operably coupled to host device 104 (for example, by wired or wireless connection), to receive data from host device 104 and to send data to host device 104. Host interface 105 may include electrical and physical connections, or a wireless connection, for operably coupling host device 104 to controller 101 (for example, via the I/O interface of controller 101). Host interface 105 may be configured to communicate data, addresses, and control signals between host device 104 and controller 101. Alternatively, the I/O interface of controller 101 may include and/or be combined with host interface 105. Host interface 105 may be configured to implement a standard interface, such as Serial-Attached SCSI (SAS), Fiber Channel interface, PCI Express (PCIe), SATA, USB, and the like. Host interface 105 may be configured to implement only one interface. Alternatively, host interface 105 (and/or the I/O interface of controller 101) may be configured to implement multiple interfaces, which may be individually selectable using a configuration parameter selected by a user or programmed at the time of assembly. Host interface 105 may include one or more buffers for buffering transmissions between host device 104 and controller 101.

Flash memory 103 represents a non-volatile memory device for storing data. According to one aspect of the subject technology, flash memory 103 includes, for example, a NAND flash memory. Flash memory 103 may include a single flash memory device or chip, or, as depicted by FIG. 1, may include multiple flash memory devices or chips arranged in multiple channels. Flash memory 103 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface hides the inner working of the flash and returns only internally detected bit values for data. In one aspect, the interface of flash memory 103 is used to access one or more internal registers 106 and an internal flash controller 107 for communication by external devices. In some aspects, registers 106 may include address, command, and/or data registers, which internally retrieve and output the necessary data to and from a NAND memory cell array 108. For example, a data register may include data to be stored in memory array 108, or data after a fetch from memory array 108, and may also be used for temporary data storage and/or act like a buffer. An address register may store the memory address from which data will be fetched to host 104 or the address to which data will be sent and stored. In some aspects, a command register is included to control parity, interrupt control, and the like. In some aspects, internal flash controller 107 is accessible via a control register to control the general behavior of flash memory 103. Internal flash controller 107 and/or the control register may control the number of stop bits, word length, receiver clock source, and may also control switching the addressing mode, paging control, coprocessor control, and the like.

In some aspects, registers 106 may also include a test register. The test register may be accessed by specific addresses and/or data combinations provided at the interface of flash memory 103 (for example, by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming parameters of flash memory 103 (for example, read levels) to dynamically vary how data is read from the memory cells of memory arrays 108.

Figure 2:
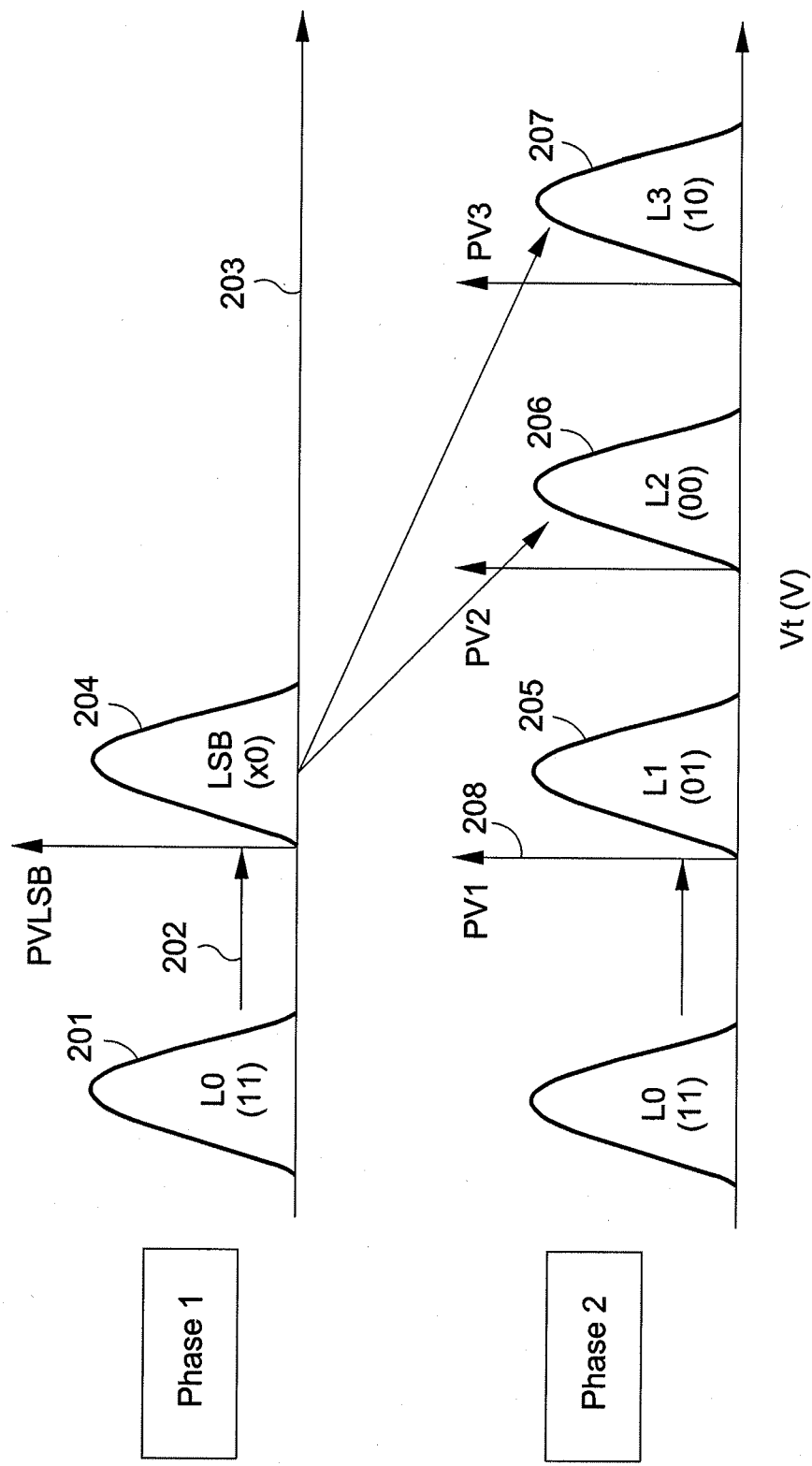
FIG. 2 is a diagram illustrating an exemplary graph diagram of four possible cell $V_T$ distributions and complimentary program verify levels for a group of memory cells in a multi-level cell flash memory according to one aspect of the subject technology.

The storage capacity of SSDs can be increased using MLC NAND flash memory. MLC provides for more than one bit per cell by choosing between multiple levels of electrical charge (read level) to apply to the floating gates of its cells to achieve multiple states of conductivity, each occurring at a different threshold voltage $V_T$. FIG. 2 is a diagram illustrating an exemplary graph diagram of four possible cell $V_T$ distributions and complimentary program verify levels for a group of memory cells in a multi-level cell flash memory according to one aspect of the subject technology. As depicted, a MLC NAND cell is capable of storing four states (levels of charge) per cell, yielding two logical bits of information per cell: the Most Significant Bit (MSB) and Least Significant Bit (LSB). These two bits may make up corresponding MSB and LSB pages of a memory block.

In some aspects, a NAND memory block is programmed one page at a time using an Incremental Step Programming Procedure (ISPP) and erased using a similar Incremental Step Erase Procedure (ISEP). In some aspects, the ISPP and/or ISEP may be performed by flash controller 107 in response to one or more commands received from controller 101. For example, the memory cells that are to be programmed by ISPP may be selected at the bit line. A "page operation" may be performed to apply a voltage at the gates of each cell in the memory page. A corresponding selection at the bit lines creates a voltage potential in the selected group of memory cells where the LSB is selected to be different (for example, binary 10 or 00) than the erased L0 distribution state 201 (for example, binary 11). Accordingly, ISPP increases 202 the threshold voltage $V_T$ 203 in the floating gates of the selected group of cells to create LSB distribution 204. Then, in a similar manner, during a MSB page program operation, ISPP is applied to create an L1 distribution 205 from the erased L0 distribution 201 (for example, binary 01), or, an L2 distribution 206 (for example, binary 00) or L3 distribution 207 (for example, binary 10) from the previously programmed LSB distribution 204. In some aspects, all of the above distributions are created from L0 distribution 201 by applying a series of ISPP voltage pulses to the memory cells of the page which is being programmed. In some aspects, the ISPP includes a series of voltage pulses that are applied in a step pattern with the amplitude of each pulse incrementally increased with increasing pulse number, starting from a certain starting magnitude. In some aspects, flash controller 107 of flash memory 103 may perform a programming verification (sensing) operation in between each step. Alternatively, this verification operation may be performed after a specific number of steps (the number of steps, for example, being stored on storage medium 102). To verify a cell has been successfully programmed, controller 107 applies a program verify voltage 208 in an attempt to conduct the cell. In some aspects, if the threshold voltage of a cell in the memory page is detected above a certain program verify level, flash controller 107 may stop further programming of that single cell by setting it to a program inhibit state.

In some aspects, LSB and MSB programming use different values of ISPP starting magnitude and/or ISPP step magnitude. Accordingly, a different ISPP step and/or starting magnitudes can be used during the MSB programming of L1 distribution 205 than in the programming of L2 distribution 206 and/or L3 distribution 207. This is because programming to a higher $V_T$ level requires the application of a higher programming voltage potential. It has been found that higher programming pulse magnitudes result in faster programming, and smaller ISPP step magnitudes and/or narrower pulse widths result in narrower final $V_T$ distributions (for example, a distribution of cells programmed to the same $V_T$ having a smaller standard deviation). In some aspects, these parameter values may be stored in storage medium 102 and accessed by controller 101 to determine (for example, calculate) further values and/or issue commands to flash memory 103. Controller 101 may be configured to communicate with flash memory 103 via registers 106 (for example, the test register) and/or flash controller 107 to provide commands for modifying certain parameters (for example, nominal parameters set by the chip manufacturer) of flash memory 103 to vary the $V_T$ distributions at run-time and/or to vary the voltages applied to conduct the memory cells (read levels). As will be further described, these parameters can be dynamically determined and/or adjusted at run-time as a function of various circuit characteristics (for example, P/E cycle, retention time, BER, temperature) and/or in response to commands received from host 104 via host interface 105.

Figure 3:
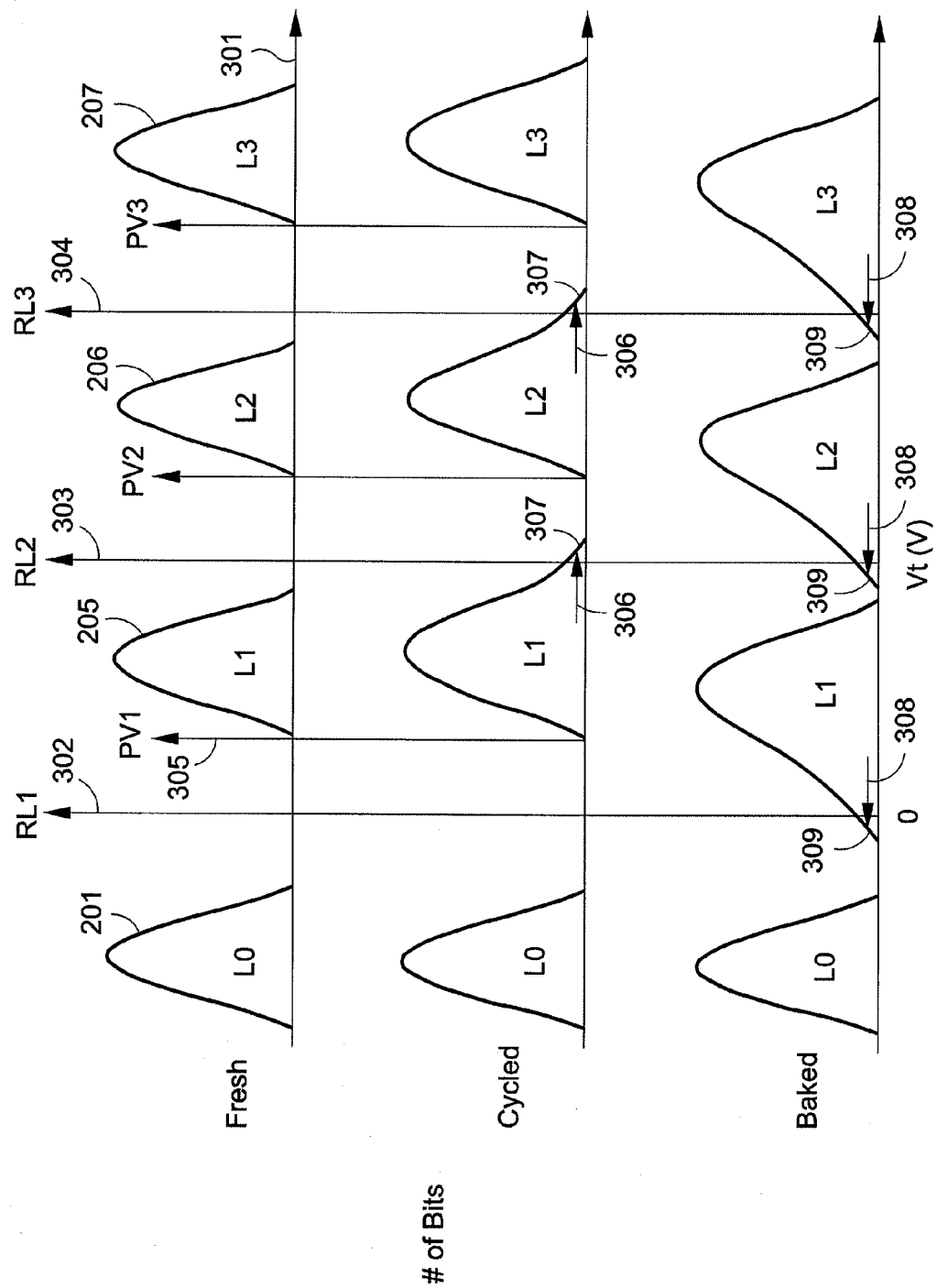
FIG. 3 is a graph diagram illustrating an exemplary threshold voltage evolution of a 2-bit MLC NAND flash memory cell with read levels chosen apriori at beginning of life according to one aspect of the subject technology.

FIG. 3 is a graph diagram illustrating an exemplary threshold voltage evolution of a 2-bit MLC NAND flash memory cell with read levels and program verify levels chosen apriori at beginning of life according to one aspect of the subject technology. The topmost row represents the four possible distributions of each programming state in a group of memory cells at a memory cell's beginning of life (BOL). The respective programming distributions of L0 distribution 201, L1 distribution 205, L2 distribution 206, and L3 distribution 207 are shown along a threshold voltage continuum 301. The middle row of FIG. 3 depicts an exemplary progression of the programming distributions after repeated P/E cycling. The buildup of electrons trapped on the floating gates of the memory cells has caused some cells be programmed with higher threshold voltages (increasing the standard deviation of the distribution at a higher $V_T$). This shift 306 in threshold voltages may eventually cause the right edges of the $V_T$ distributions to reach the higher adjacent read levels. When the $V_T$ of some of the cells in the distributions begin to cross 307 the higher read levels, the likelihood that a read operation will produce an error increases. The bottom row depicts an exemplary result of an extended retention time (for example, dwell time) on the memory cells. After a number of P/E cycles, some of the memory cells that have not been cycled have lost electrons, causing their threshold voltages to drop (increasing the standard deviation of the distribution at lower $V_T$). This shift 308 may eventually cause the left edges of the $V_T$ distributions to reach the lower adjacent read levels. The more cycles over which data is retained the more extreme the decline. If the read levels remain fixed, the $V_T$ distributions that have crossed 309 the next lower read level may cause significant errors.

With reference to the top row of FIG. 3, after ISPP, the edges of each of the distributions are suitably spaced from adjacent read levels. In some aspects, spacing can be altered by setting program verify voltages 305 (for example, PV1, PV2, and/or PV3) during the verification operation sufficiently higher than a lower read level, but sufficiently low enough to prevent even those cells in the distribution having the highest $V_T$ (largest deviation) from crossing the next higher read level. To ensure that all cells in a distribution will conduct, a read level voltage greater than the distribution is applied. In this regard, RL1 voltage 302 will cause cells in L0 distribution 201 to conduct, RL2 voltage 303 will cause cells in L1 distribution 205 to conduct, RL3 voltage 304 will cause cells in L2 distribution to conduct, and so on. Where, as depicted by FIG. 3, only four states are available, RL voltage 304 will not cause any cells in L3 distribution 207 to conduct, thereby generating a binary x0 in the LSB (see FIG. 2) for those cells. Generally, for N distributions there will be N–1 read levels. In the depicted example, there are four distributions (of states) and three read levels. Those skilled in the art will recognize that there may be eight, sixteen, or more distributions without departing from the scope of the subject technology.

Read Level Predictor

Controller 101 may be configured to perform certain prediction operations before reading memory 103 to predict whether the last read level voltage used to read data remains at an acceptable value or whether a new read level voltage should be estimated to compensate for a shift in $V_T$ distribution, to reduce BER. In some aspects, these operations may be performed on one or more blocks of memory at a time, however, one skilled in the art will recognize that controller 101 can be manufactured or programmed to perform the operations with regard to any number of cells, including individual cells or one or more pages or strings. In some aspects, controller 101 may be configured to provide the read level prediction in conjunction with estimating a new read level. When used with read level estimation, it has been found that predicting whether a read level should be estimated prior to performing a read operation saves time and power consumption that would otherwise be needed by read level estimations that would occur had the prediction not been performed. Additionally, the cost (time and power) of predicting a read level is specifically less than estimating a read level on every read, and, the chance of success rate has been found to be high, avoiding the cost of a read failure that could otherwise result from not predicting, or mis-predicting, a read level. In one aspect:

Prediction Success Rate Target>1–(Prediction Savings/Cost of Misprediction)   (1)

Where

Prediction Savings=Cost of Estimation*(1–Frequency of Estimation)–Cost of Prediction Thus, for example, using power as figure of cost, where Algorithm computation unit power is 0.1 mW/DMIPS Prediction algorithms is 100 instructions or clocks per flash read operation Estimation algorithm is 1000 instructions or clocks per flash read operation Drive performs 10 k Read/Second Frequency of estimation is 5% results in

Prediction Power=0.1 mW

Estimation Power=1 mW

Misprediction Power=Read Power=100 mW, and the Prediction Success Rate will have to be equal to greater than 99% {1–[1 mW*(1–5%)–0.1 mW]/100 mW}.

Figure 4:
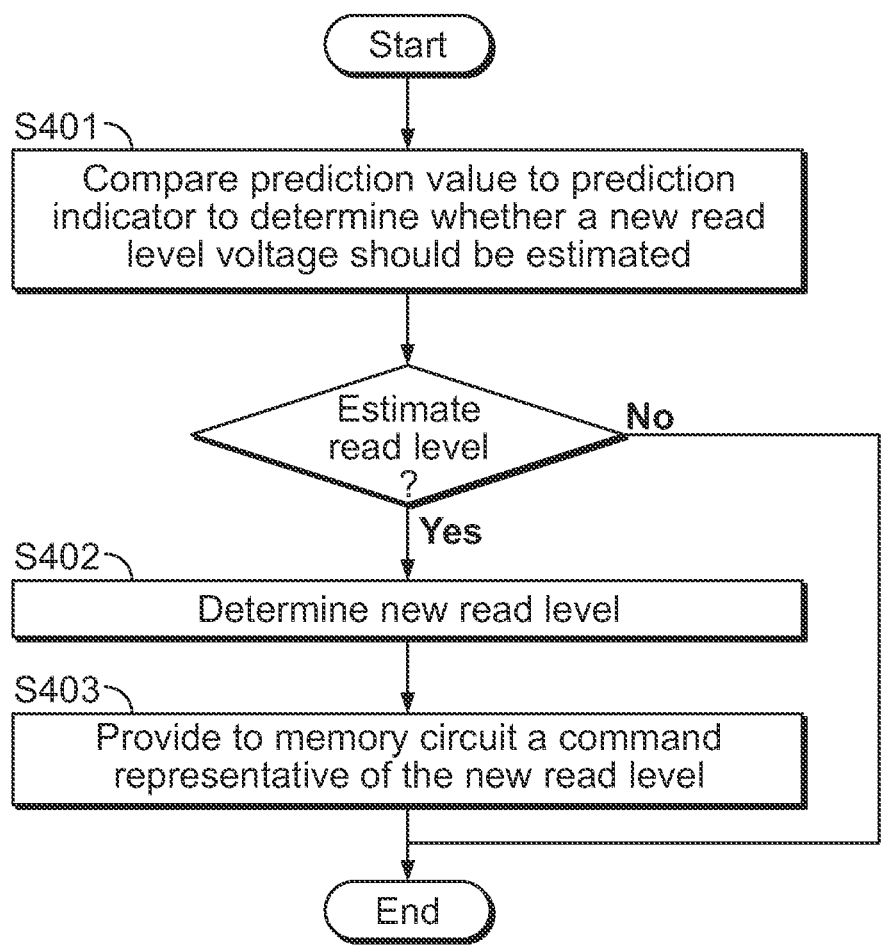
FIG. 4 is a flowchart illustrating a process for predicting when current read levels and/or settings are suspect according to one aspect of the subject technology.

FIG. 4 is a flowchart illustrating a process for predicting when current read levels and/or settings are suspect according to one aspect of the subject technology. Prior to undertaking the estimation procedure, controller 101 receives from host device 104 an instruction representative of a read operation. Controller 101 generates a prediction value, and, in some aspects, determines the prediction value from characteristics associated with the memory block being read. For example, as will be described in more detail below, these characteristics may include whether the last operation on the block was a write operation, whether the page being read is a marginal or critical address, comparing read level margins and read level margin thresholds, and/or a previous read level value (see FIG. 5). In some aspects, controller 101 may be configured to retrieve the prediction value and/or characteristics from a lookup table stored on storage medium 102 or storage medium 103, or the like. Controller 101 further retrieves a prediction indicator from a lookup table stored on storage medium 102. As will be described in more detail below, the prediction indicator may include a Boolean value, a marginal or critical address, read level margin thresholds, a previous read level value, and/or the like. It is not necessary that the prediction value and predication indicator are generated in any particular sequence but, rather, in some aspects, they may be generated in substantially parallel operations.

In step S401, controller 101 performs a compare operation to compare the prediction value to the prediction indicator to determine whether a read level voltage should be estimated. If the result of the compare operation is positive (for example, the prediction value and prediction indicator are equal) then the process proceeds to step S402 to estimate/determine a new read level. Otherwise, the process terminates and a read is performed on the memory using existing read levels and/or parameters. In Step S403, controller 101 generates a programming command representative of the new read level voltage to read the memory cell and provides it to flash memory 103 (for example, via registers 106).

Figure 5:
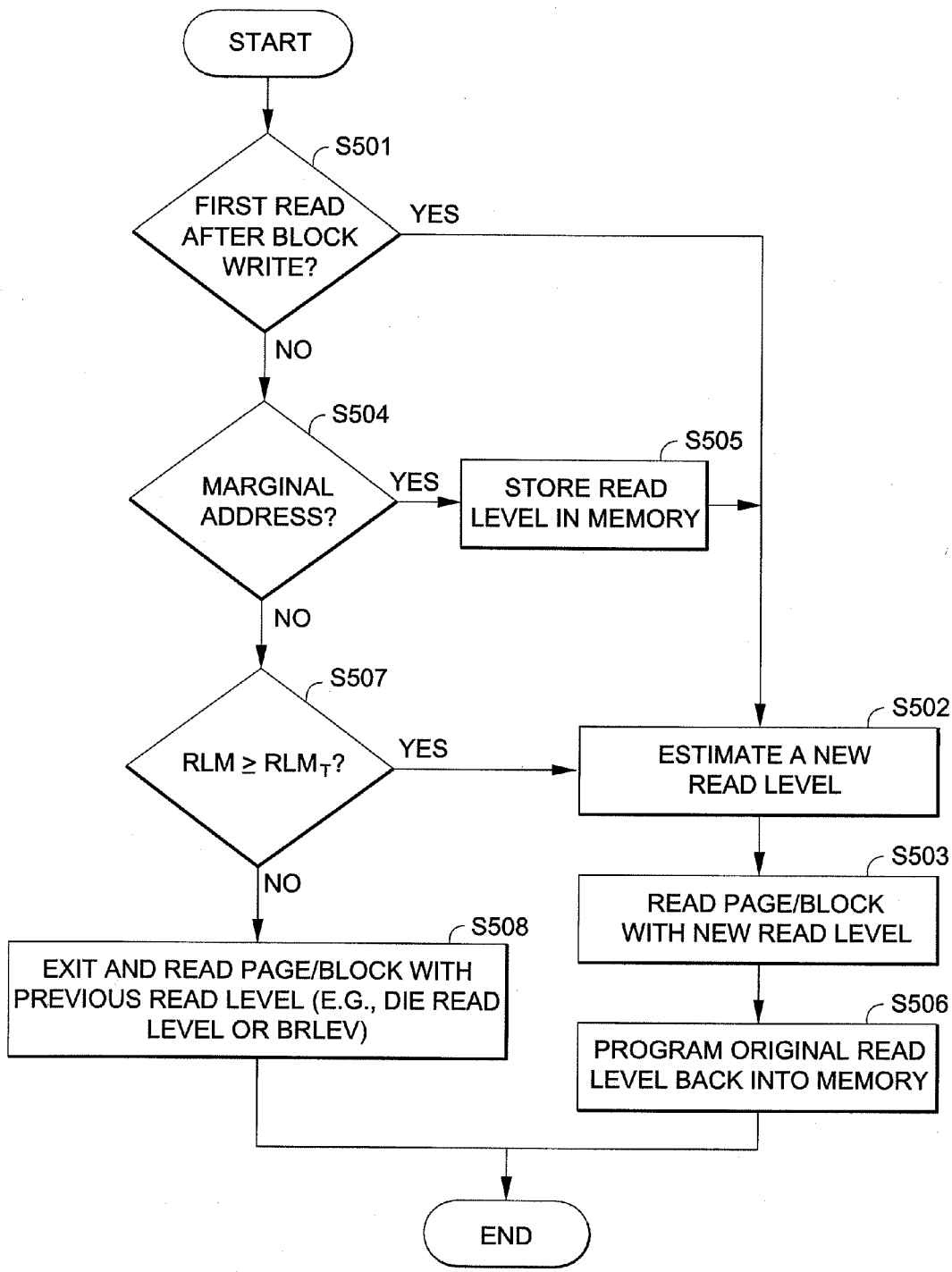
FIG. 5 is a flowchart illustrating an alternative process for predicting when current read levels and/or settings are suspect according to one aspect of the subject technology.

FIG. 5 is a flowchart illustrating an alternative process for predicting when current read levels and/or settings are suspect according to one aspect of the subject technology. Prior to undertaking the process, controller 101 receives an instruction from host device 104 representative of a read operation. In step S501, when reading a block of flash memory 103, controller 101 determines whether the block is being read for the first time after a write operation. In some aspects, prior to this determination, controller 101 sets a Boolean flag associated with the block to TRUE after a write operation (Just Written Flag). Before a read operation is undertaken, controller 101 determines whether the Boolean flag is TRUE, and if so, sets the flag to FALSE and proceeds to step S502 to estimate a new read level. In step S503, the page and/or block is read using the new read level.

Otherwise, if the block is not being read for the first time after a write operation, the process proceeds to step S504. In step S504, controller 101 determines whether the read address is equal to a marginal address stored on a lookup table in storage medium 102 (for example, by XOR with an address mask). In some aspects, a marginal address may be an address that likely needs a specific read level voltage to avoid generating a high BER. Those skilled in the art will recognize techniques and methods for determining which addresses are likely to generate a high BER (for example, from a sector bit error memory map). If the read address is equal to the marginal address the process proceeds to step S502 to estimate a new read level. Prior to estimating the new read level, since the new read level was triggered by an address within the block (for example, the first and last pages of the block), the read level may be temporarily modified so that further read levels for the block remain unchanged. In optional step S505 (designated as by dotted lines), the present read level is temporarily stored in memory (for example, storage medium 102, flash memory 103, or the like), and then the read level estimated in step S502 and the read performed in step S503. Then, in optional step S506 (also designated as by dotted lines), after the read operation has been completed, controller 101 may program the original read level back into memory. In other aspects, if controller 101 determines that the read address is not equal to a marginal address then the process proceeds to step S507.

Prior to step S507, controller 101 determines a Read Level Margin (RLM) value as a function of an error level value from a previous read, and a number of program/erase (P/E) cycles. In one aspect, RLMs reduce as read error levels increase and P/E cycles increase. In some aspects, controller 101 determines the error level value as a function of a quality of a previous read operation. Taking $K_{EL}$ as a factor associated with Error Level (EL), where EL is a measure of the quality of a previous read operation (for example, the number of bits in error per sector and/or page data read):

$K_{EL} = K_{EL0}$ if $0 < EL < EL_1$;

$K_{EL1}$ if $EL_1 < EL \leq EL_2$;

$K_{EL2}$ if $EL_2 < EL \leq EL_3$; and $K_{EL3}$ if $EL_3 < EL$;   (2)

where, for example:

$K_{EL0} = 1, K_{EL1} = 2, K_{EL2} = 4, K_{EL3} = 8$;

$EL_1 = 1$ bit/512 Byte, $EL_2 = 3$ bit/512 Byte, $EL_3 = 5$ bit/512 Byte.

Taking $K_{PE}$ as a factor associated to a range of P/E cycles:

$K_{PE} = K_{PE0}$ if $0 < P/E < PE_1$;

$K_{PE1}$ if $PE_1 < P/E \leq PE_2$;

$K_{PE2}$ if $PE_2 < P/E \leq PE_3$; and $K_{PE3}$ if $PE_3 < P/E$;   (3)

where, for example:

$K_{PE0} = 1, K_{PE1} = 2, K_{PE2} = 4, K_{PE3} = 8$; and $PE_1 = 5$ k $P/E, PE_2 = 10$ k $P/E, PE_3 = 20$ k $P/E$.

Therefore, in one aspect, $RLM = K_{EL} \times K_{PE}$. The values associated with $K_{EL}$ and $K_{PE}$ may be indexed by their respective ranges and stored in one or more look up tables (for example, on storage medium 102). Controller 101 may access the one or more look up tables to compare the number of error bits generated from the previous read operation to the Error Level ranges to generate $K_{EL}$, and compares the current number of P/E cycles to the P/E ranges to generate $K_{PE}$. In step S507, controller 101 determine whether the calculated RLM is greater or equal to a Read Level Margin threshold ($RLM_T$). If it is then the process proceeds to step S502 to estimate a new read level. Otherwise, if RLM is less than $RLM_T$, the process proceeds to step S508 and the previous read level is used. Table 1 is an exemplary lookup table of RLM thresholds:

TABLE 1

Lookup Table of RLM Thresholds

| RLM | $0 < EL < EL_1$ | $EL_1 < EL \leq EL_2$ | $EL_2 < EL \leq EL_3$ | $EL_3 < EL$ |
|---|---|---|---|---|
| $0 < P/E < PE_1$ | 1 | 2 | 4 | 8 |
| $PE_1 < P/E \leq PE_2$ | 2 | 4 | 8 | 16 |
| $PE_2 < P/E \leq PE_3$ | 4 | 8 | 16 | 32 |
| $PE_3 < P/E$ | 8 | 16 | 32 | 64 |

In some aspects, Table 1 is an exemplary lookup table stored on storage medium 102 which stores RLM values corresponding to EL range limits $EL_1$, $EL_2$, and $EL_3$, and P/E cycle range limits $PE_1$, $PE_2$, and $PE_3$. In the above example, $RLM_T$ is set at 16. Thus, in this example, if controller 101 determines RLM to be greater than 16 then it will predict that a new read level should be estimated, otherwise, controller 101 will proceed with a read operation using the previous read level.

In one aspect, a $RLM_T$ value is stored for each block. In other aspects, one or more $RLM_T$ values may be stored for a group of blocks or all blocks. In some aspects, storage medium 102 will be sufficient to save the number of error bits generated from the previous read operation and the previous Block Read Level Value (BRLEV) for each block. If controller 101 changes a BRLEV at the completion of a read, controller 101 stores the BRLEV for use by a future read operation for the same block. In some aspects, where BRLEV is defined on a block by block basis, controller 101 does not have to account for a variation across all blocks and $RLM_T$ can take on a higher value, for example, $RLM_T = 32$, thereby reducing the frequency of Read Level estimation and thus computations over P/E cycles and Error Level.

In other aspects, storage medium 102 will not be sufficient to save the read level for each block. On startup, controller 101 may access flash memory 103 to retrieve a nominal read level (for example, from the test register) and store and/or use that value for all read predictions across all blocks (die read level), or use a default value(s) set within software executed by controller 101. Since $RLM_T$ may account for block to block read variations, $RLM_T$ may take on a higher value, for example, $RLM_T = 16$, resulting in more frequent estimation of new read levels as P/E cycles and Error Levels increase.

Read Level Estimator

Figure 6:
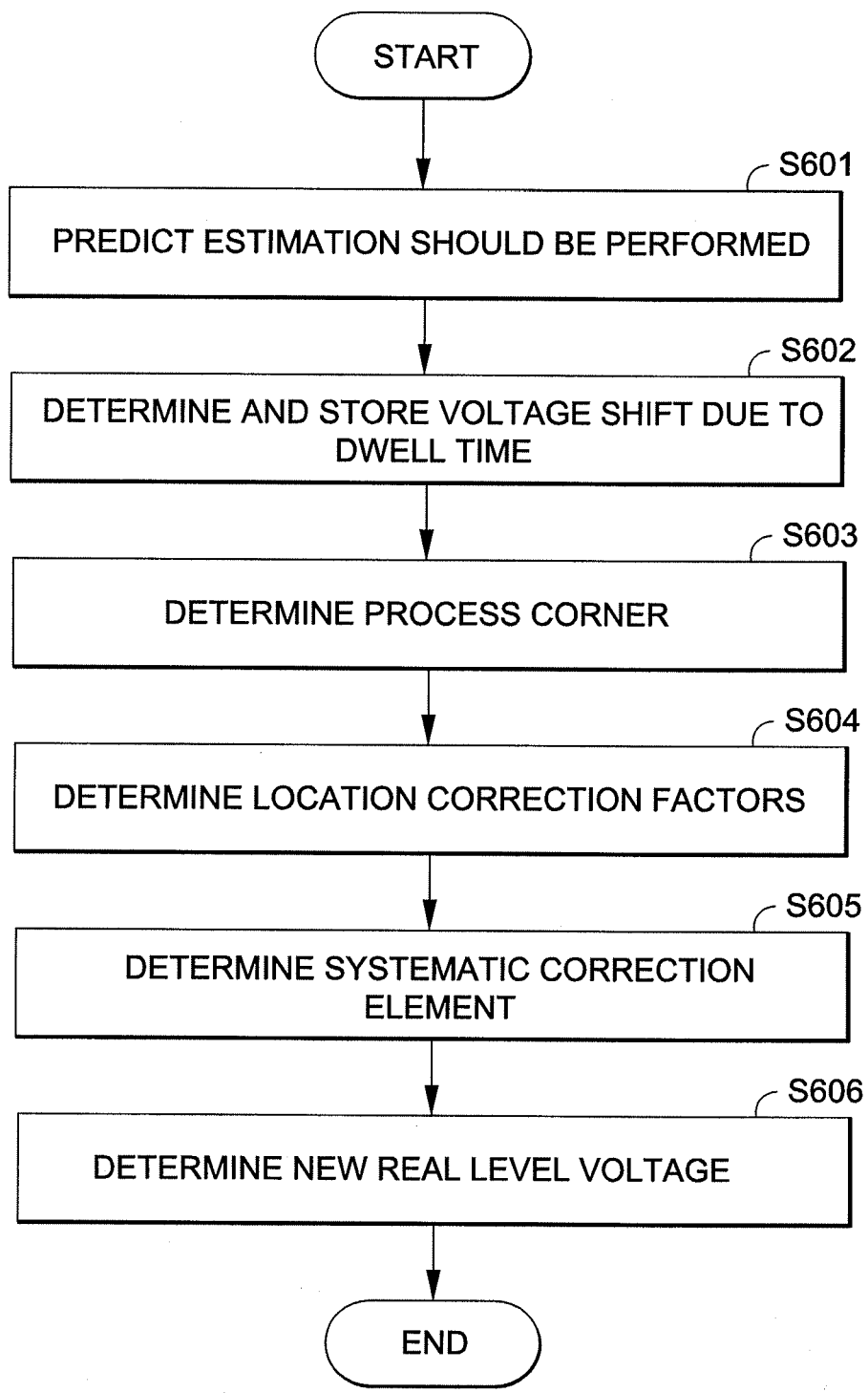
FIG. 6 is a flowchart illustrating a process for estimating a Read Level (RL) voltage to apply to the memory cells of a memory block according to one aspect of the subject technology.

FIG. 6 is a flowchart illustrating a process for estimating a read level voltage to apply to the memory cells of a memory block according to one aspect of the subject technology. In step S601, controller determines that a new read level voltage should be estimated (see FIGS. 4 and 5). In step S602, a Voltage Shift due to Dwell Time ($\Delta V_{DT}$) is determined (for example, calculated) and stored in storage medium 102 for the block being read. In some aspects, $\Delta V_{DT}$ is the optimal $V_T$ shift needed to correct a distribution of cells at nominal process conditions and nominal case temperature for different P/E cycles and dwell times. As will be described below, $\Delta V_{DT}$ values may be a result of a flash memory characterization and stored in a lookup table on storage medium 102. The number of columns and rows of the lookup table depends on the number of P/E cycle and dwell time ranges to be covered, and $\Delta V_{DT}$ precision. Storage medium 102 may also include other information relative to $\Delta V_{DT}$ that is updated periodically, for example, setting and/or storing a Block Time Stamp (representative of the Dwell Time) for each block on each read operation performed on the memory block.

Figure 7:
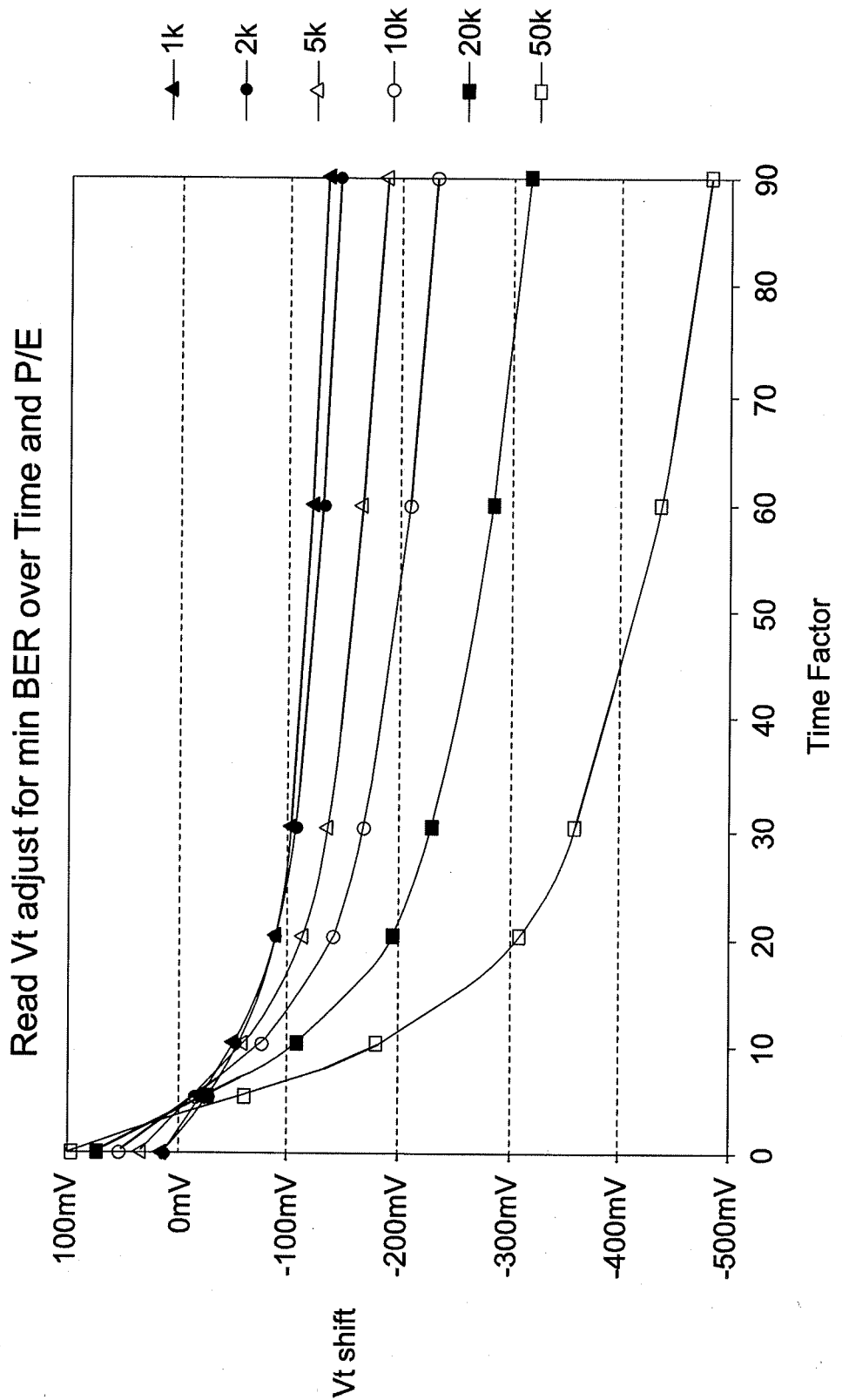
FIG. 7 is an exemplary characterization of a 41 nm MLC flash memory depicting the $V_T$ shift necessary to achieve a minimum BER over time (P/E cycles) according to one aspect of the subject technology.

Turning briefly to FIG. 7, an exemplary characterization of a 41 nm MLC flash memory is shown depicting a $V_T$ shift (mV) at predetermined intervals to achieve a minimum BER over the life of the memory (for example, a number of P/E cycles) according to one aspect of the subject technology. From this exemplary characterization seven dwell time ranges with quadratic values can be identified. Dwell Time resolution may be stored as a 7-bit value to cover a 1× to 128× range, or as a 8-bit value to cover a 1× to 256× range. Table 2 is an exemplary lookup table with dwell time ranges defined from 1× to 128× cross-referenced with eight P/E cycle intervals.

TABLE 2

$\Delta V_{DT}$ Lookup Table (mV)

| $\Delta V_{DT}$ | 1× | 2× | 4× | 8× | 16× | 32× | 64× | 128× |
|---|---|---|---|---|---|---|---|---|
| 2k | 0 | 0 | −50 | −100 | −100 | −100 | −100 | −100 |
| 5k | 0 | 0 | −50 | −100 | −150 | −150 | −200 | −200 |
| 10k | 50 | 0 | −50 | −150 | −200 | −200 | −300 | −300 |
| 20k | 50 | 0 | −100 | −150 | −300 | −300 | −400 | −400 |
| 30k | 100 | −50 | −100 | −200 | −350 | −350 | −400 | −400 |
| 40k | 100 | −50 | −150 | −250 | −400 | −400 | −450 | −450 |
| 50k | 100 | −50 | −200 | −300 | −450 | −450 | −500 | −500 |
| 60k | 100 | −50 | −250 | −350 | −500 | −500 | −550 | −600 |

In the above example, 1× Dwell Time corresponds to ½ hour at a Reference Temperature 75 C. For instance, after 30 k cycles, a 2 hour dwell time will produce a −100 mV shift. This allows for covering up to 64 hours, or 2.6 days, time, for which the $V_T$ distribution shift is minimal at even a high number of P/E cycles. In one aspect of enterprise applications, the probability of data lifetimes exceeding 2.5 days has been found to be relatively low, and for which additional read failure recovery mechanisms may be acceptable (for example, ECC). One skilled in the art will recognize how to adapt the above characterization to other flash memory devices. Accordingly, once flash memory 103 has been characterized the $\Delta V_{DT}$ lookup table can be populated and stored on storage medium 102.

In some aspects, dwell times are first converted to the dwell time scale of Table 2 based on the temperature of data storage system 100 (for example, actual drive temperature). Storage system 100 includes an internal temperature sensor 109 (for example, a thermocouple or thermometer) that provides system 100 with a drive operating temperature ($T_s$) measured at a reference location. A Temperature Conversion Factor ($AF_{T=75C}$) is obtained by the Arrhenius equation to statistically predict and model a shift acceleration due to temperature:

$$AF_T = e^{\frac{Ea}{k}\left(\frac{1}{T_0} - \frac{1}{T_S}\right)} \qquad (4)$$

where k=Boltzmann's constant=8.617×10$^{-5}$ eV/K;

$T_0$=75 C. reference temperature (K);

$T_S$=actual drive operating temperature (K); and

Ea=activation energy for the respective failure mechanism: 1.1 eV for NAND flash technology.

In one aspect, the block's dwell time is multiplied by $AF_T$ prior to referencing the lookup table represented by Table 2 to more accurately predict $\Delta V_{DT}$ as a function of drive temperature. In further aspects, rather than determining $AF_T$ at runtime, storage system 100 may store a lookup table on storage medium 102 that includes $AF_T$ values. Table 3 is an exemplary list of $AF_T$ values calculated for different temperatures at Ea=1.1 eV:

TABLE 3

Lookup Table of $AF_T$ values

| | $AF_T$ | | $T_S$ | | | | | | |
|---|---|---|---|---|---|---|---|---|---|
| | | 40 | 55 | 60 | 65 | 70 | 75 | 80 | 85 |
| $T_0$ | 40 | 1 | 6.4 | 11.6 | 20.4 | 35 | 60 | 101 | 168 |
| | 55 | 1.6E−01 | 1 | 1.8 | 3 | 5 | 9 | 16 | 26 |
| | 60 | 8.7E−02 | 5.6E−01 | 1 | 1.8 | 3 | 5 | 9 | 15 |
| | 65 | 4.9E−02 | 3.2E−01 | 5.7E−01 | 1 | 1.7 | 3 | 5 | 8.2 |
| | 70 | 2.8E−02 | 1.8E−01 | 3.3E−01 | 5.8E−01 | 1 | 1.7 | 3 | 4.7 |
| | 75 | 1.7E−02 | 1.1E−01 | 1.9E−01 | 3.4E−01 | 5.9E−01 | 1 | 1.7 | 2.8 |
| | 80 | 9.9E−03 | 6.4E−02 | 1.1E−01 | 2.0E−01 | 3.5E−01 | 6.0E−01 | 1 | 1.7 |
| | 85 | 6.0E−03 | 3.8E−02 | 6.9E−02 | 1.2E−01 | 2.1E−01 | 3.6E−01 | 6.0E−01 | 1 |

In further aspects, dwell times are converted to the dwell time scale based on the temperature of flash memory 103 (for example, actual die temperature). In this regard, a drive level temperature characterization may require a die temperature variation against the reference location where temperature sensor 109 is located. It has been found that the temperature variation of flash memory 103 may be somewhat independent from the drive temperature provided by internal temperature sensor 109. Therefore, in some aspects, the calculation of $\Delta V_{DT}$ may also include a Die Temperature Adjustment factor ($k_{TF}$) to model Temperature Conversion Factor $AF_T$ as a factor of die temperature. Thus, for example, $$T'_S = T_S \times k_{TF}. \qquad (5)$$

Figure 8A:
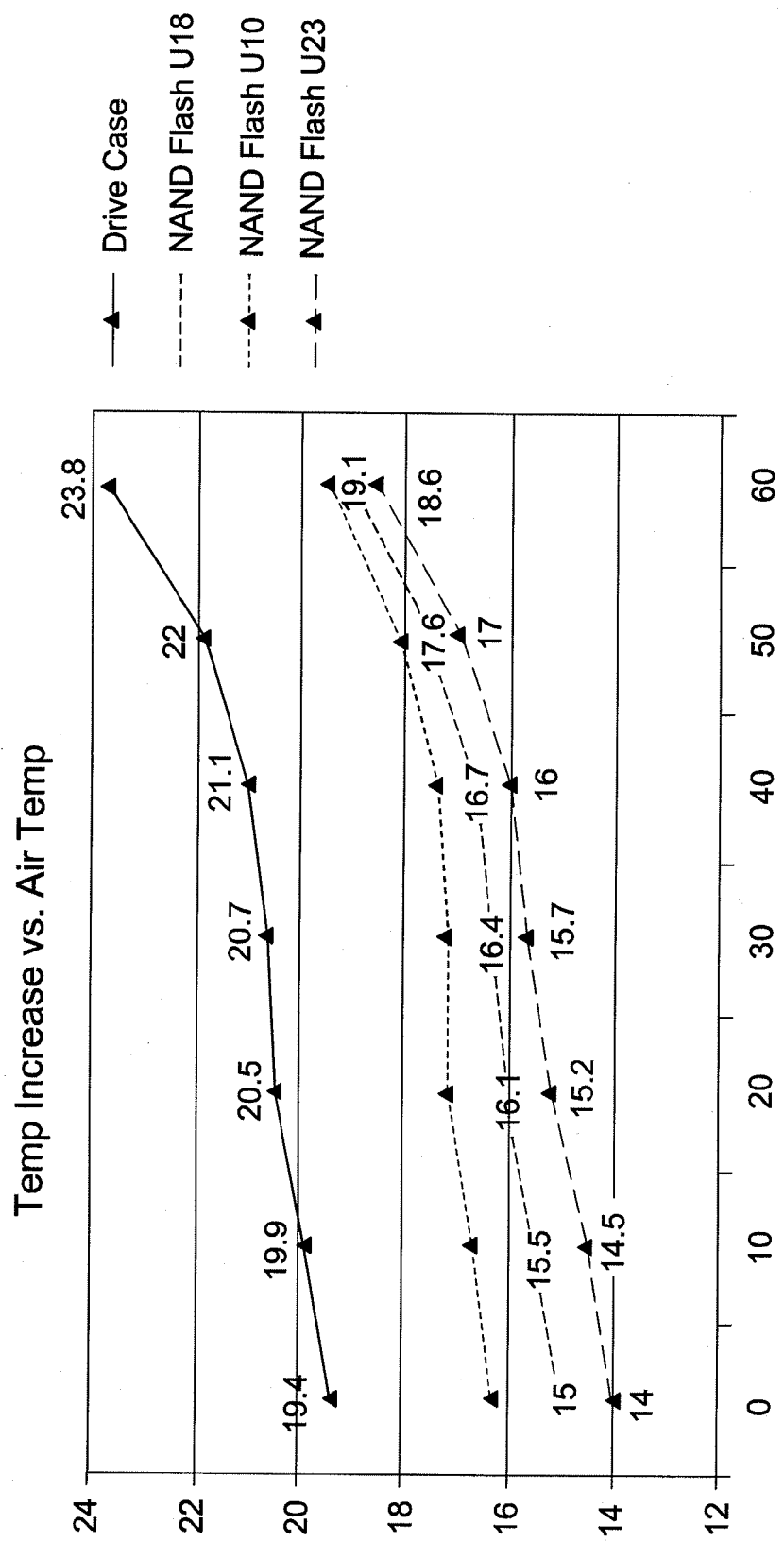
FIG. 8A is a graph diagram illustrating die temperature increase relative to drive temperature increase over predetermined intervals of P/E cycles according to one aspect of the subject technology.

Accordingly, a second lookup table for $k_{TF}$ is provided where $\Delta V_{DT}$ is a function of Temperature Conversion Factor $AF_T$ and Die Temperature Adjustment factor $k_{TF}$ (for example, $\Delta V_{DT}=(P/E, DT, AF_{T=75C} \times k_{TF})$). FIG. 8A is a graph diagram illustrating die temperature increase relative to drive temperature increase over predetermined intervals of P/E cycles according to one aspect of the subject technology. In one aspect, $k_{TF}$ is generated for the increase in die temperature (for example, at memory 103) relative to the drive temperature taken at temperature sensor 109. In some aspects, the data represented in FIG. 8 is stored in one or more lookup tables on storage medium 102. Controller 101 may be configured to index the one or more lookup tables using a drive temperature retrieved from internal temperature sensor 109 to retrieve Die Temperature Adjustment factor $k_{TF}$. From the example of FIG. 8, approximately four different temperature ranges may be defined:

$$C_0 = T_{REF} \text{ to } T_{REF}+1C;$$

$$C_2 = T_{REF}+1C \text{ to } T_{REF}+3C;$$

$$C_3 = T_{REF}+3C \text{ to } T_{REF}+5C; \text{ and}$$

$$C_6 = T_{REF}+5C \text{ to } T_{REF}+7C \text{ or more.}$$

In that regard, Table 4 provides an exemplary list of Die Temperature Adjustment factors $k_{TF}$ and their percentage change over 75 C. for NAND flash memory at a given drive temperature. Thus, Table 4 can be implemented as a lookup table for $k_{TF}$, indexed by drive temperature value and/or range. The lookup table may be stored on storage medium 102 for access by controller 101 when determining $\Delta V_{DT}$. It has been found that, given the base reference value of 75 C., the error of $AF_T$ determined from Table 4 is within 15% for the range 40 C. to 105 C. for NAND flash memory.

TABLE 4

Die Temperature Correction Factor

| | $C_0$ | $C_2$ | % | $C_4$ | % | $C_6$ | % |
|---|---|---|---|---|---|---|---|
| 40 | 1 | 1.30 | 5.1% | 1.67 | 10.3% | 2.15 | 15.6% |
| 55 | 1 | 1.27 | 2.7% | 1.60 | 5.3% | 2.01 | 8.0% |
| 60 | 1 | 1.26 | 1.9% | 1.58 | 3.9% | 1.97 | 5.8% |
| 65 | 1 | 1.25 | 1.3% | 1.55 | 2.5% | 1.93 | 3.8% |
| 70 | 1 | 1.24 | 0.6% | 1.54 | 1.2% | 1.90 | 1.8% |
| 75 | 1 | 1.23 | 0.0% | 1.52 | 0.0% | 1.86 | 0.0% |
| 80 | 1 | 1.23 | −0.6% | 1.50 | −1.2% | 1.83 | −1.7% |
| 85 | 1 | 1.22 | −1.1% | 1.48 | −2.3% | 1.80 | −3.3% |
| 90 | 1 | 1.21 | −1.7% | 1.47 | −3.3% | 1.77 | −4.9% |
| 95 | 1 | 1.21 | −2.2% | 1.45 | −4.3% | 1.74 | −6.3% |
| 100 | 1 | 1.20 | −2.7% | 1.44 | −5.2% | 1.72 | −7.7% |
| 105 | 1 | 1.19 | −3.1% | 1.42 | −6.1% | 1.69 | −9.0% |

Turning back to FIG. 6, in addition to determining Voltage Shift due to Dwell Time ($\Delta V_{DT}$), in step S603, controller 101 determines a process corner factor as a function of a nominal process corner associated with flash memory 103 and a number of P/E cycles. Process corners represent the extremes of parameter variations within which a flash memory circuit must function correctly. Process variations during the manufacture of the flash memory device may result in different electrical parameters which may affect device characteristics, including data retention. In one aspect, a process variation may cause a $\Delta V_{DT}$ shift acceleration over time and temperature. To model this effect, a $\Delta V_{DT}$ Shift Acceleration Factor ($k_{PC}$) may be defined at different P/E cycles for different process corner values and stored on storage medium 102. Table 5 is an exemplary lookup table for determining a process corner factor ($k_{PC}$) as a scaling factor to be used when estimating the new RL voltage. Column S=Slow Corner (−1s); Column T=Typical Corner (0s); Column F=Fast Corner (+1s); and Column FF=Very Fast Corner (+3s).

TABLE 5

Lookup Table of $k_{PC}$ values for process corner

| $k_{PC}$ | S | T | F | FF |
|---|---|---|---|---|
| 2k | 0.25 | 0.5 | .09 | 3 |
| 5k | 0.3 | 0.6 | 1.8 | 6 |
| 10k | 0.4 | 0.8 | 2.4 | 8 |
| 20k | 0.5 | 1 | 3 | 10 |
| 30k | 0.6 | 1.4 | 4.2 | 14 |
| 40k | 1 | 2 | 6 | 20 |
| 50k | 1.5 | 3 | 9 | 30 |
| 60k | 0.9 | 5 | 15 | 250 |

In addition to process corner factor $k_{PC}$, in step S604, controller 101 determines Location Correction Factors as a function of a Block Location/Address in memory cell array 108 and/or a Page Location/Address in the block. In one aspect, block location and page address result in different variations of $V_T$ shift over P/E cycles. In that regard, flash characterization can provide further address dependency and sensitivity (scaling) factors. Block locations and/or page locations sensitive to $V_T$ shift are stored in one or more lookup tables on storage medium 102, and indexed by P/E cycle or range of P/E cycles. Each block location is associated with a Block Address Factor $k_{BK}$, and each Page Location is associated with a Page Address Factor $k_{PG}$. In some aspects, a logical mask to a flash memory address may be used to identify a page address and/or a block address range(s) to determine what scaling factors to use. Controller 101 may access the one or more lookup tables on storage medium 102 to retrieve factors $k_{BK}$ and $k_{PG}$ and apply those values as factors in estimating the new read level voltage.

In step S605, controller 101 determines a Systematic Correction Factor $S_{CF}$. In some aspects, following a read operation (successful or unsuccessful), controller 101 collects information related to a read operation (for example, BER, $V_T$ used, and the like) to verify the quality of the read operation. If the quality is below a predetermined level (for example, determined by ECC), controller may determine $S_{CF}$ from BER, statistics on errors from previous read operations, $V_T$ displacement from re-read iterations following a read failure, and the like. In one aspect, $S_{CF}$ may be known apriori. For example, they may be determined during a flash read level characterization before product implementation, and/or computed by a procedure executed by controller 101 (or other processor and/or circuit) through post-process read error and read retry operations. When $S_{CF}$ is defined (and/or associated to a block or page location in a block) the $S_{CF}$ is added to the read level estimation (for example, as a read level offset).

Figure 8B:
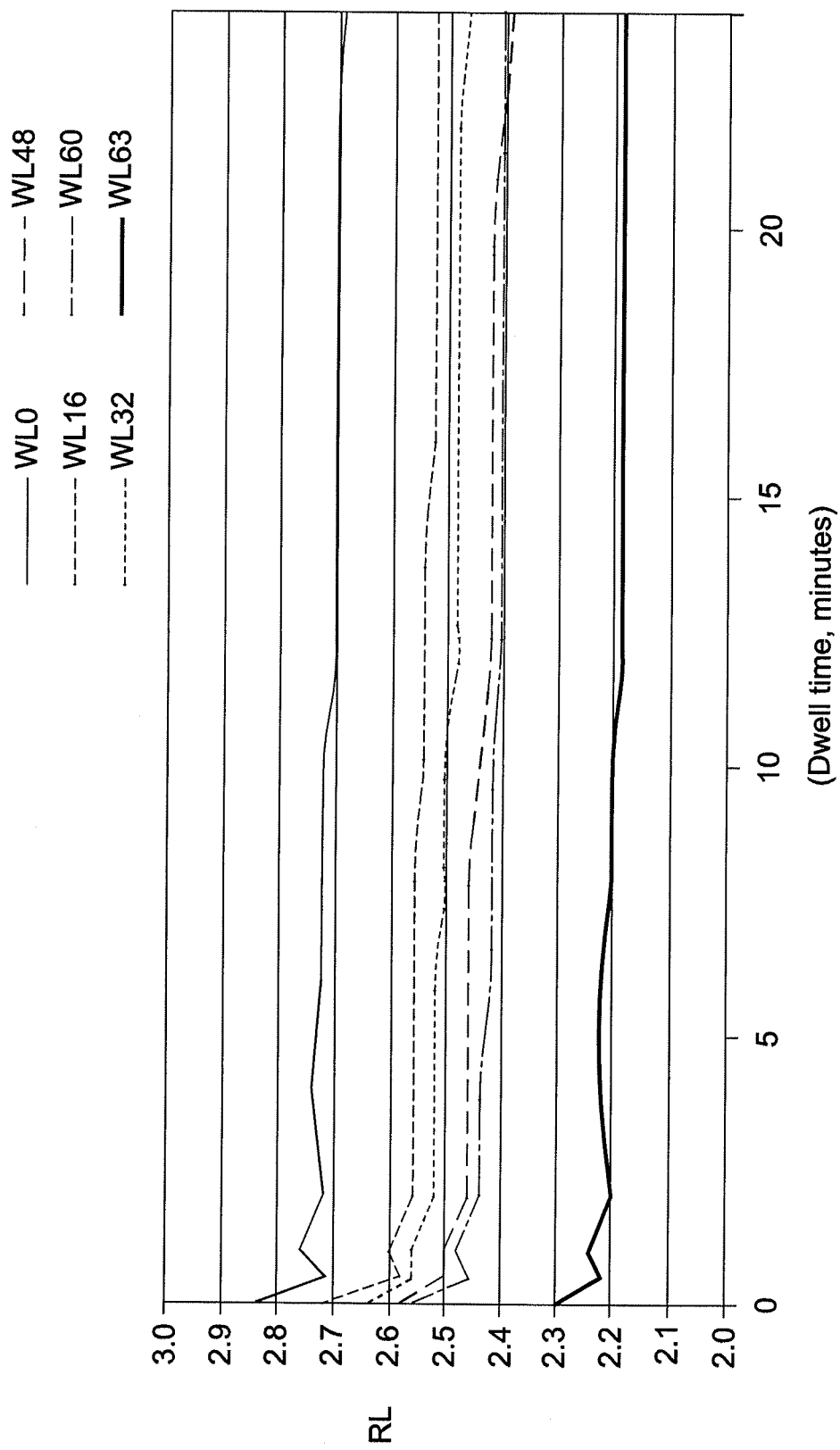
FIG. 8B is a graph diagram illustrating read level offsets for exemplary word lines and their respective pages in a memory block according to one aspect of the subject technology.

FIG. 8B is a graph diagram illustrating read level offsets (for example, relative to dwell time) for exemplary word lines and their respective pages in a memory block according to one aspect of the subject technology. In the illustrated example, read levels are given for pages associated with selected word lines after a predetermined number of cycles (for example, 50,000). As illustrated by FIG. 8B, pages associated with word line 0 (WL0) may have a $S_{CF}$ of 200 mV versus pages associated with world line 32 (WL32), while pages in word line 63 (WL63) may have a $S_{CF}$ of −300 mV versus pages in word line 32 (WL32). In a further aspect, no correction factor may be required for pages that are within +/−50 mV. The correction factor values may be included in one or more lookup tables (for example, on storage medium 102) and indexed by word line, page and/or block address, and/or the like. In other aspects, controller 101 may be configured to determine $S_{CF}$ values based the information obtained from a previous read operation. Accordingly, controller 101 may include the $S_{CF}$ value in the read level estimation process to compensate for systematic errors.

In step S606, controller 101 determines the read level voltage as a function of the previous Read Level voltage (for example, stored on storage medium 102 or based on a nominal value) and an Estimation Parameter determined (for example, calculated) from the previously described factors. In some aspects, the Estimation Parameter is derived from the formula:

$$\Delta V_{DT} = (P/E, DT, AF_{T=75C} \times k_{TF}) \times k_{PC}(P/E, \text{Corner}) \times k_{BK}(\text{Block Address}) \times k_{PG}(\text{Page Address}) + S_{CF}(\ ). \quad (6)$$

If $RL_{NOM}$ is taken to be the nominal read level from factory settings or a previous read level stored on storage medium 102, then:

$$RL_{EST} = RL_{NOM} + \text{Estimation Parameter.} \quad (7)$$

In some aspects, on determining the estimated Read Level voltage, in step S606, controller 101 programs flash memory 103 by setting the data and/or command registers of flash registers 106 (for example, the flash test registers), and/or sends commands to flash controller 107. In some aspects, the settings and/or programming commands are representative of the read level voltage. In further aspects, flash memory 103 sets $RL_{EST}$ for the specific block/page of memory array 108 based on register values programmed into internal registers 106.

Figure 9:
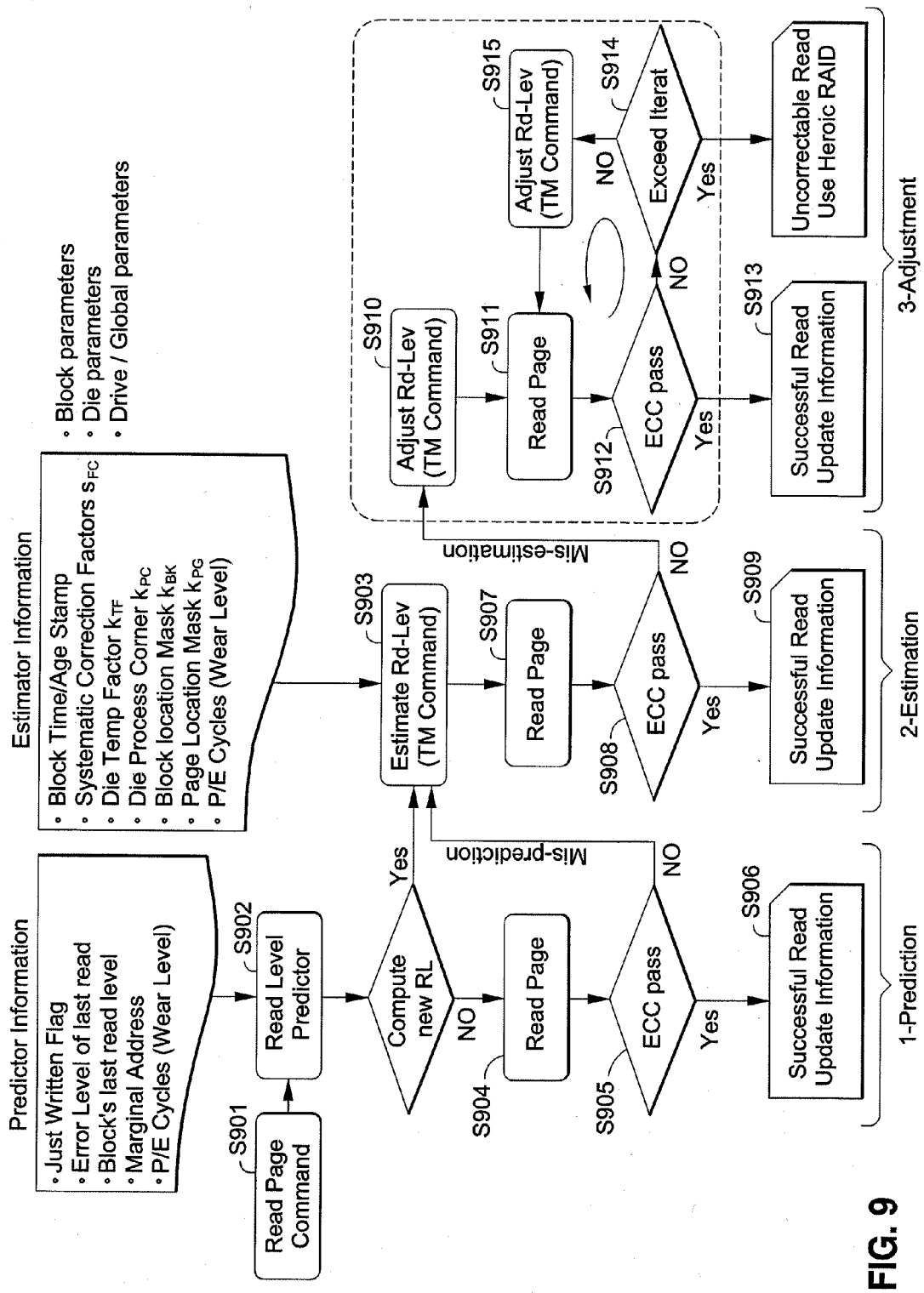
FIG. 9 is a flowchart illustrating an overall process for predicting, estimating and adjusting a read level according to one aspect of the subject technology.

FIG. 9 is a flowchart illustrating an overall process for predicting, estimating and adjusting a read level according to one aspect of the subject technology. In step S901, controller 101 receives a read command from host 104 (for example, via interface 105). Then, in step S902, controller 101 attempts to predict whether a new read level voltage should be estimated. In some aspects, the prediction is determined according to the above procedure described with reference to FIG. 4 and/or FIG. 5. If a new read level voltage should be estimated then controller will proceed to step S903 to estimate a new value in accordance with the above procedure described with reference to FIG. 6. Otherwise, if controller 101 determines that no estimation is necessary, in step S904, controller 101 executes commands to read memory 103 in accordance with the read command. After a read operation is completed, in step S905, controller 101 verifies the quality of the read using Error Correction Coding (ECC). Those skilled in the art will recognize how to verify the quality using various ECC schemes. If the BER is below a predetermined acceptable limit (for example, determined by a number of errors correctable by ECC), in step S906, controller 101 completes the read operation by returning the data to host 104 via interface 105 and stores and/or updates prediction information (for example, Read Level, BER, BRLEV, Just Written Flag, Error Level, Block Time Stamp, $S_{CF}$, and the like) to storage medium 102. Turning back to step S903, after estimation, in step S907, controller 101 will complete the read operation and proceed to step S908 to verify the quality of the read data using ECC. Providing the results of ECC are acceptable, in step S909, controller 101 will return the data, and store prediction information and/or estimation (for example, store/update read level). If the result of ECC is not acceptable after estimation, controller 101 will attempt to undertake a read level adjustment and re-read the page and/or block of memory 103.

Read Level Adjustment

With continued reference to FIG. 9, in some aspects, if controller determines a re-read of memory 103 is required, controller 101 adjusts the read level conditions and performs one or more re-read operations. The criteria for the read level used by each re-read operation can be either a "blind" read using a predefined number of read level steps or an "adaptive" operation whereby a new read level is computed from the parameters and/or results of the previous read operation or operations/attempts (for example, a quality metric). In step S910, following a read failure, the read level is adjusted by determining a revised read level (RRL) voltage as a function of the read level voltage and a correction element. In some aspects, the correction element is the previously described Systematic Correction Element $S_{CF}$, or an updated value of the same. In step S911, controller 101 will complete a re-read operation and proceed to step S912 to verify the quality of the read using ECC. Providing that the results of ECC are acceptable, in step S913, controller 101 will return the data and store prediction and/or estimation information (for example, store/update the read level). If the result of ECC is not acceptable after a re-read, controller 101 will increment a number of re-read iterations and, in step S914, determine if a maximum number of iterations (for example, stored in storage medium 102) has been exceeded. If the maximum number of iterations has not been exceeded, in step S915, controller 101 will attempt to undertake a subsequent read level adjustment and re-read the page and/or block of memory 103 in accordance with step S911. In some aspects, the adjustment may include determining a threshold voltage displacement factor as a function of the number of re-read iterations, and then determining $S_{CF}$ as a function of the threshold voltage displacement factor. If the number of re-read iterations is exceeded then controller 101 returns an error reporting the read was uncorrectable. In some aspects, storage system 100 and/or host 104 can undertake a mitigation strategy such as accessing a RAID.

Figure 10:
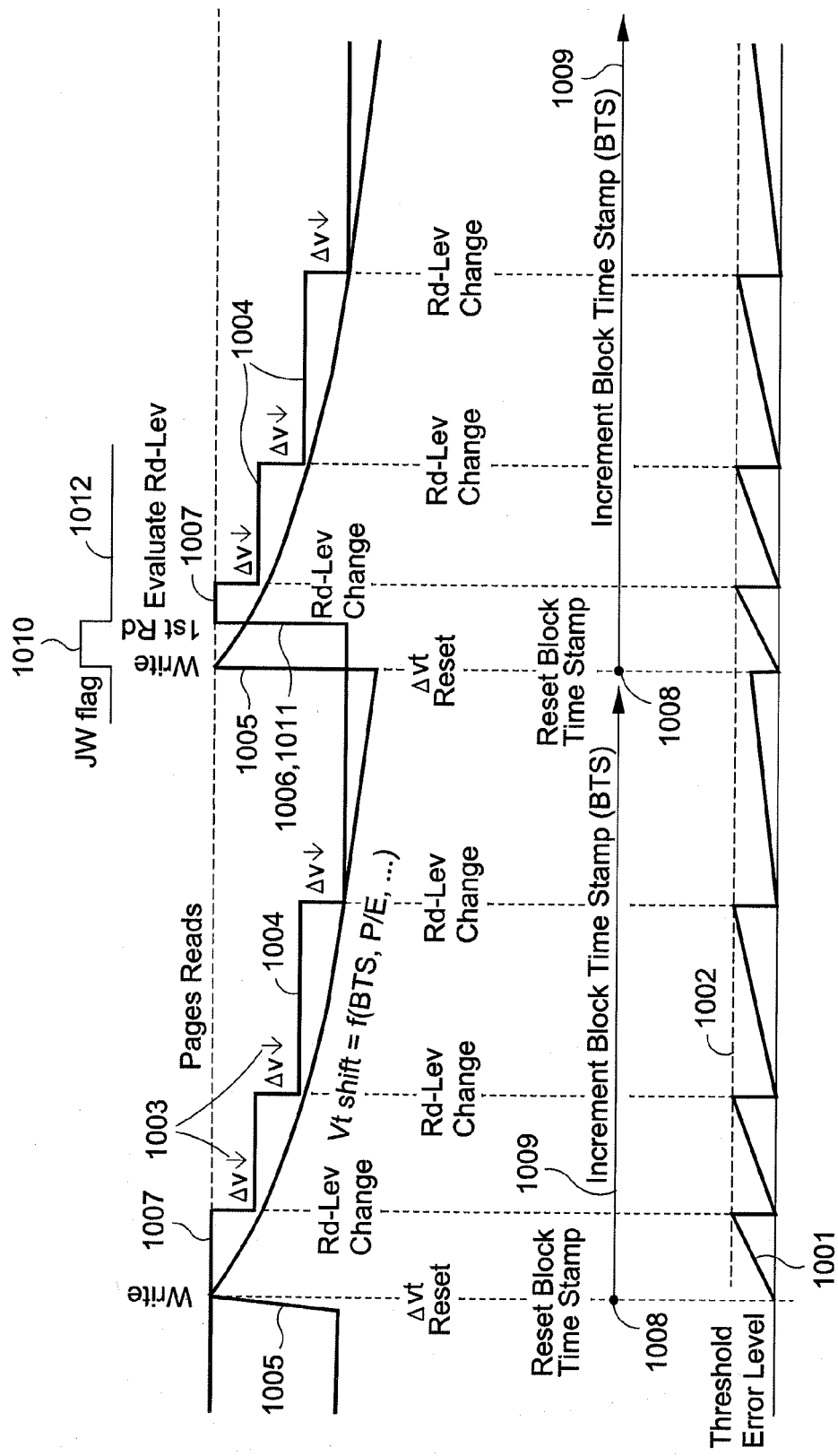
FIG. 10 is a graph diagram of a threshold voltage adjustment over time and read and write operations according to one aspect of the subject technology.

FIG. 10 is a graph diagram of a threshold voltage adjustment over time and read and write operations according to one aspect of the subject technology. In one aspect, when the error level 1001 exceeds a given threshold 1002, controller 101 will undertake to execute a new read level computation at the next read operation (see FIG. 6). According to the previously described procedure, controller 101 will estimate a shift 1003 in read level voltage 1004. In one aspect, read level voltage 1004 will shift left (reduce) with increasing dwell time. In other aspects, read level voltage 1004 will shift right (increase) as P/E cycles increase (see FIG. 3). In one aspect, on each write operation 1005, controller 101 resets 1006 the estimated shift 1003 in read level voltage 1004 (FIG. 6) to its initial (or nominal) value 1007, and performs a Block Time Stamp (BTS) Reset 1008 to reset the Block Time Stamp associated (for example, stored on storage medium 102) with the block on which the write was executed. Accordingly, the first read operation will compute a new read level. On each subsequent read operation, controller increments 1009 the BTS to keep track of the dwell time for the block. In one aspect, controller 101 sets a Just Written Flag 1010 on a write operation to notify the first subsequent read operation that a new read level voltage should be determined (see, for example, FIG. 5, step S502). On a first subsequent read 1011, controller 101 clears 1012 Just Written Flag 1010.

Power-off Read Level Management

When storage device 100 is unpowered, the voltage levels of the floating gates of memory cells within flash memory 103 may decay with time and temperature. Thus, at power-on, the read conditions (for example, read levels) of pre-existing data may have to be changed to account for the cells' $V_T$ shift in distribution while storage device 100 was unpowered. The $V_T$ shift during power-off is in addition to the $V_T$ shift that a memory block may have had because of dwell time prior to power-off. Moreover, after power-on, each block may be read at a different time and thus require an additional $V_T$ shift component due to dwell time after power-on.

Figure 11:
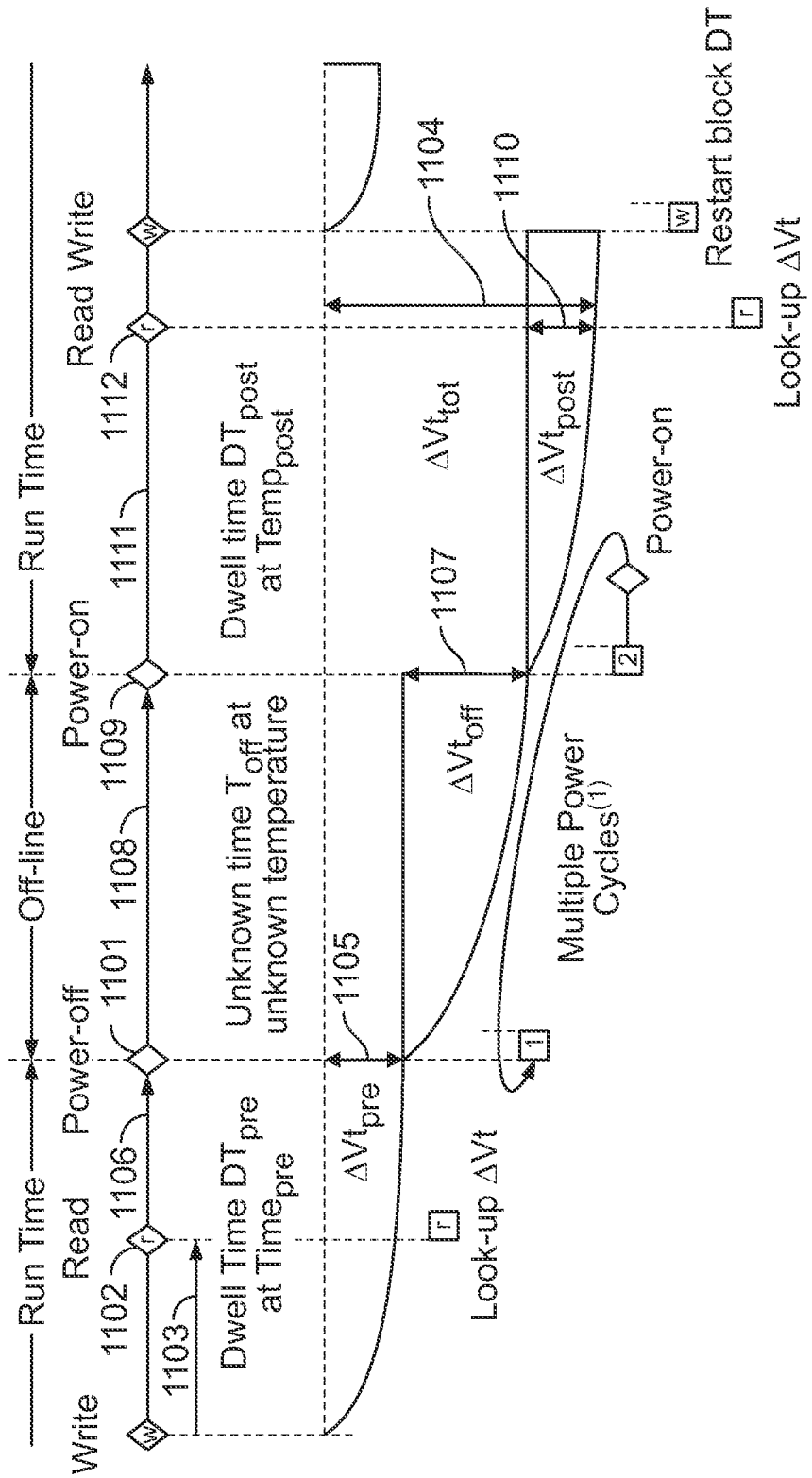
FIG. 11 is a graph diagram of the $V_T$ shift in a non-volatile memory circuit generated while the circuit is active and off-line according to one aspect of the subject technology.

FIG. 11 is a graph diagram of a $V_T$ shift in a non-volatile memory circuit generated while the circuit is active and off-line according to one aspect of the subject technology. As previously described, a $V_T$ shift is determined as a function of various factors, including, among other factors, a voltage shift due to dwell time ($\Delta V_{DT}$). During run-time and prior to power-off 1101, if an estimation is predicted for a read operation 1102, a first block dwell time 1103 is determined for the memory block to be read. As described previously, controller 101 may determine the memory block's dwell time by subtracting the current time (or read time) from a Block Time Stamp (BTS) stored in conjunction with the memory block. However, if storage device 100 is powered down, temperatures and other operational factors may change. Thus, accurately determining a total $V_T$ shift 1104 may include determining the sum of a first $V_T$ shift 1105 occurring prior to power-off 1101 from a pre-shutdown dwell time 1106 under run-time operating conditions, a second $V_T$ shift 1107 generated from a power-off dwell time 1108 ($T_{Off}$) during the inactive state prior to power-on 1109, and a third $V_T$ shift 1110 generated from a post-shutdown dwell time 1111 during run-time operating conditions between power-on 1109 and a post-power-on read 1112.

Figure 12A:
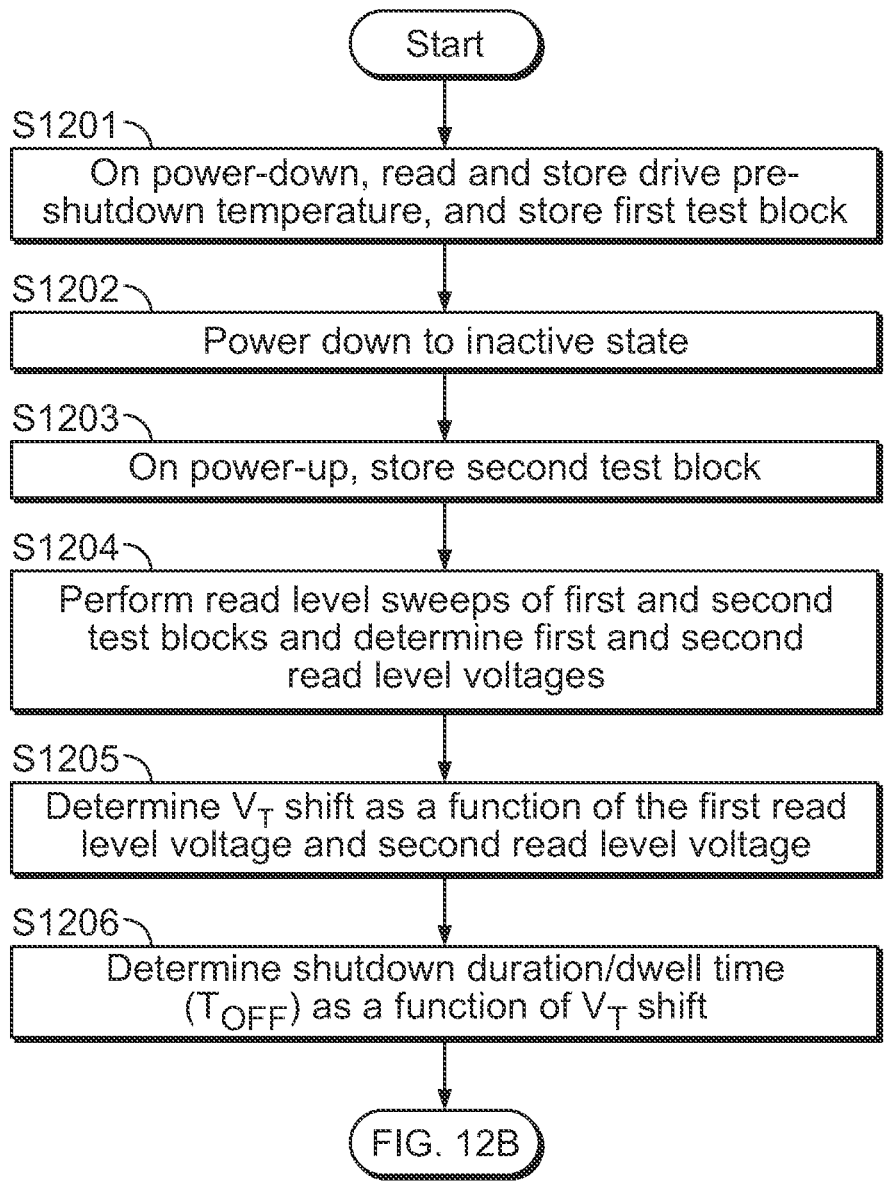
FIGS. 12A and 12B are flowcharts illustrating a process for determining a dwell time for each block in a memory circuit after a shutdown of the memory circuit according to one aspect of the subject technology.
Figure 12B:
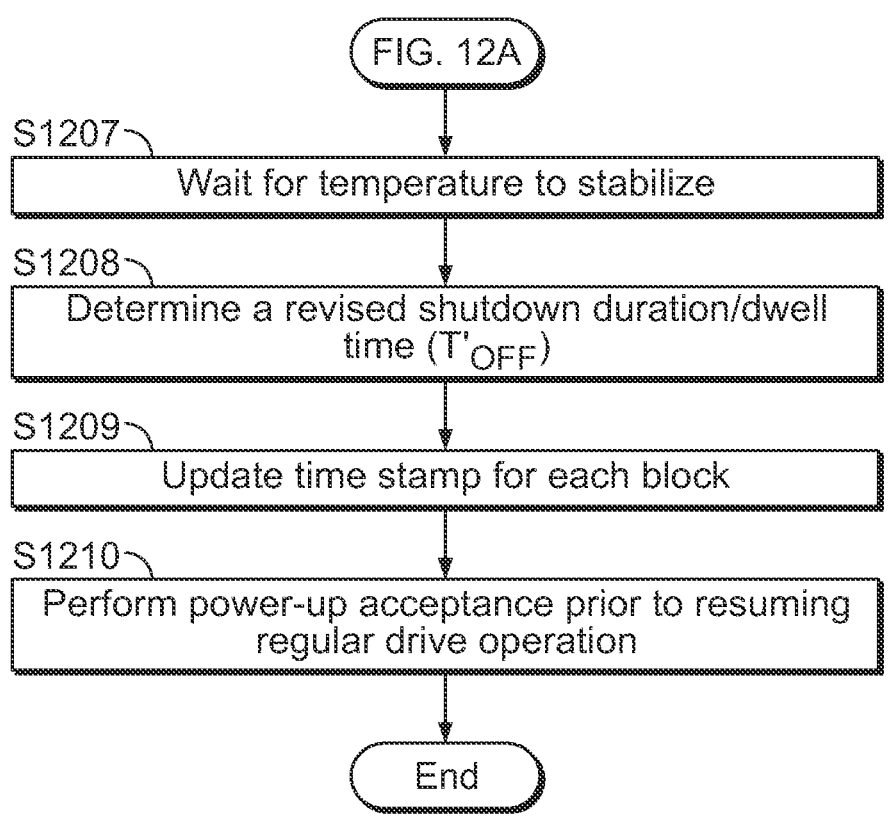

FIGS. 12A and 12B are flowcharts illustrating a process for determining a dwell time for each block in a memory circuit after a shutdown of the memory circuit according to one aspect of the subject technology. In step S1201 (FIG. 12A), on storage device 100 receiving an instruction to power-down, controller 101 takes a reading of internal temperature sensor 109 to obtain a pre-shutdown temperature and then stores the pre-shutdown temperature and a first test block in flash memory 103. In other aspects, controller 101 may store the pre-shutdown temperature and the address of a block written just before power-off (last written block) in storage medium 102. In further aspects, controller 101 may store other parameters (for example, wear leveling data) during the shutdown process. After all data is stored and the shut down process has completed, in step S1202, storage device 100 will power down flash memory 103 and remain in an inactive state for a period of time.

In step S1203, storage device 100, including flash memory 103, is powered-on and a second test block is stored. In some aspects, where there may be more than one flash memory 103, controller 101 saves the second test block in the same die of flash memory 103 as the first test block was saved. In step S1204, controller 101 performs read level sweeps of the first and second test blocks, and determines respective first and second read level voltages. In this regard, controller 101 may perform a first read level sweep of the first test block to determine a first read level voltage with minimum errors ($V_{T-Amin}$). In some aspects, the read level sweep may include determining the first read level voltage as a function of a nominal read level voltage and an estimation parameter, and then adjusting as needed, in accordance with the procedures previously described with respect to FIG. 9. In a similar manner, controller 101 may perform a second read level sweep of the second test block to determine a second read level voltage with minimum errors ($V_{T-Bmin}$). In step S1205, $V_T$ shift 1107 is then determined as a function of the first and second read level voltages. In one aspect, $V_T$ shift 1107 may be determined by subtracting the first read level voltage from the second read level voltage (for example, $V_{T-Bmin} - V_{T-Amin}$).

In step S1206, controller 101 determines a shutdown duration/power-off dwell time 1108 ($T_{Off}$) as a function of $V_T$ shift 1107. In some aspects, the power-off dwell time 1108 ($T_{Off}$) during which storage device 100 was inactive may be determined by indexing a dwell time lookup table by $V_T$ shift 1107 and the current P/E cycles stored at shutdown. In some aspects, $T_{Off}$ may be determined by performing a reverse lookup on Table 2.

In step S1207 (FIG. 12B), controller 101 waits a period of time for the temperature of storage device 100 to stabilize. Then, in step S1208, controller 101 determines a revised shutdown duration/power-off dwell time 1108 ($T'_{Off}$). In one aspect, controller 101 may take a reading of internal temperature sensor 109 to obtain a post-power temperature. Controller 101 may then determine a first post-power temperature acceleration factor $AF_{T(Temp-Ref \Rightarrow Temp-Post)}$ from the post-power (current) temperature and a Reference Temperature (for example, 75 C.). Power-off dwell time ($T_{Off}$) 1108 may then be multiplied by $AF_{T(Temp-Ref \Rightarrow Temp-Post)}$ to obtain a revised dwell time ($T_{Off}$) 1108 at the current drive temperature (from, for example, internal temperature sensor 109).

In steps S1209 and S1210, each block's time stamp is updated. In step S1209, a total dwell time is determined. To this end, a temporary dwell time ($DT_{Pre}$) may be determined by subtracting the block's current BTS from the current time. In one aspect, controller 101 may retrieve the pre-shutdown temperature that was stored in step S1201, take a present reading of internal temperature sensor 109 to obtain a post-power temperature, and then determine a second post-power temperature acceleration factor $AF_{T(Temp-Pre \Rightarrow Temp-Post)}$ from the pre-shutdown temperature and the post-power temperature. The block's total dwell time ($DT_{New}$) may then be determined by multiplying $DT_{Pre}$ by $AF_{T(Temp-Ref \Rightarrow Temp-Post)}$ and then adding $T_{Off}$ (revised dwell time 1108). In step S1210, controller 101 updates the Block Time Stamp (BTS) for each block. Accordingly, each BTS is updated by subtracting the block's total dwell time ($DT_{New}$) from the current time. Each BTS may be stored on storage medium 102 or stored in conjunction with the block on flash memory 103. After each BTS has been updated, in step S1211, controller 101 initiates a shutdown acceptance. If a shutdown occurs before shutdown acceptance then controller 101 sets a Power-up Incomplete error flag. Otherwise, storage device 100 resumes regular operation.

The above shutdown and recovery procedure assumes that, while storage device 100 is active, the temperature is stable. In one aspect, the procedure uses 8 bits for each block to store the BTS. At power-on, controller 101 determines each block's total dwell time by executing the subtraction, addition, and multiplication steps previously described on each block with valid data. During this time no power-off cycle can be started without creating an error.

Figure 13A:
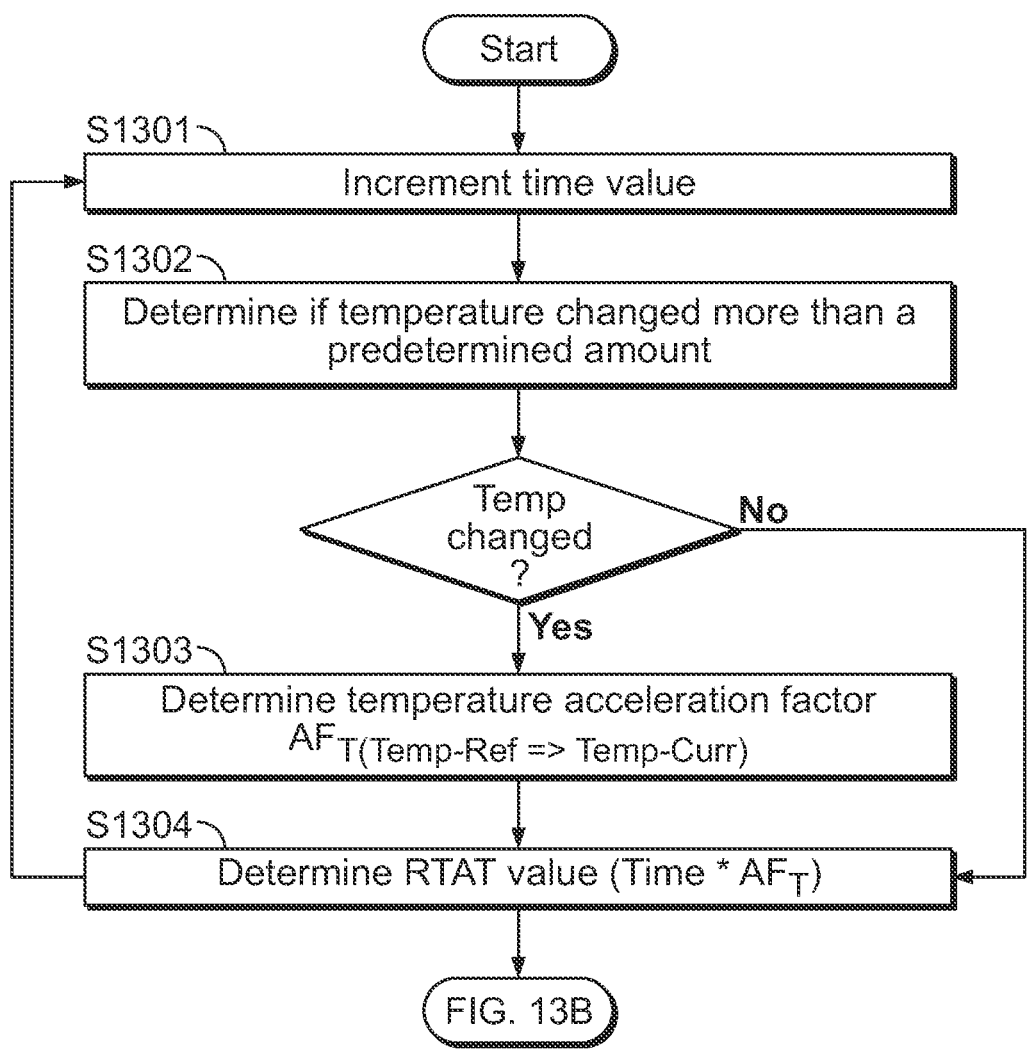
FIGS. 13A to 13C are flowcharts illustrating an alternative process for determining a dwell time for each block in a memory circuit after a shutdown of the memory circuit according to one aspect of the subject technology.
Figure 13B:
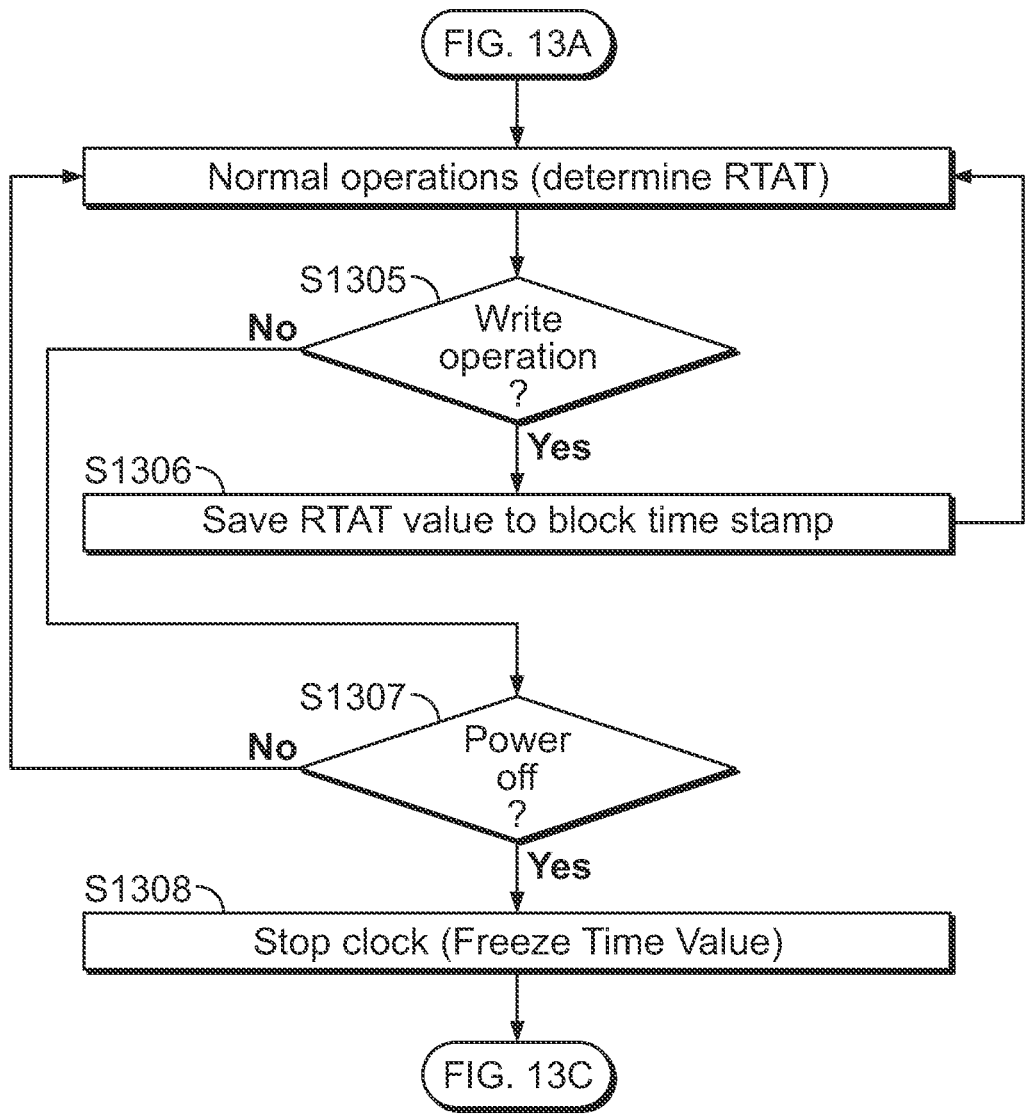
Figure 13C:
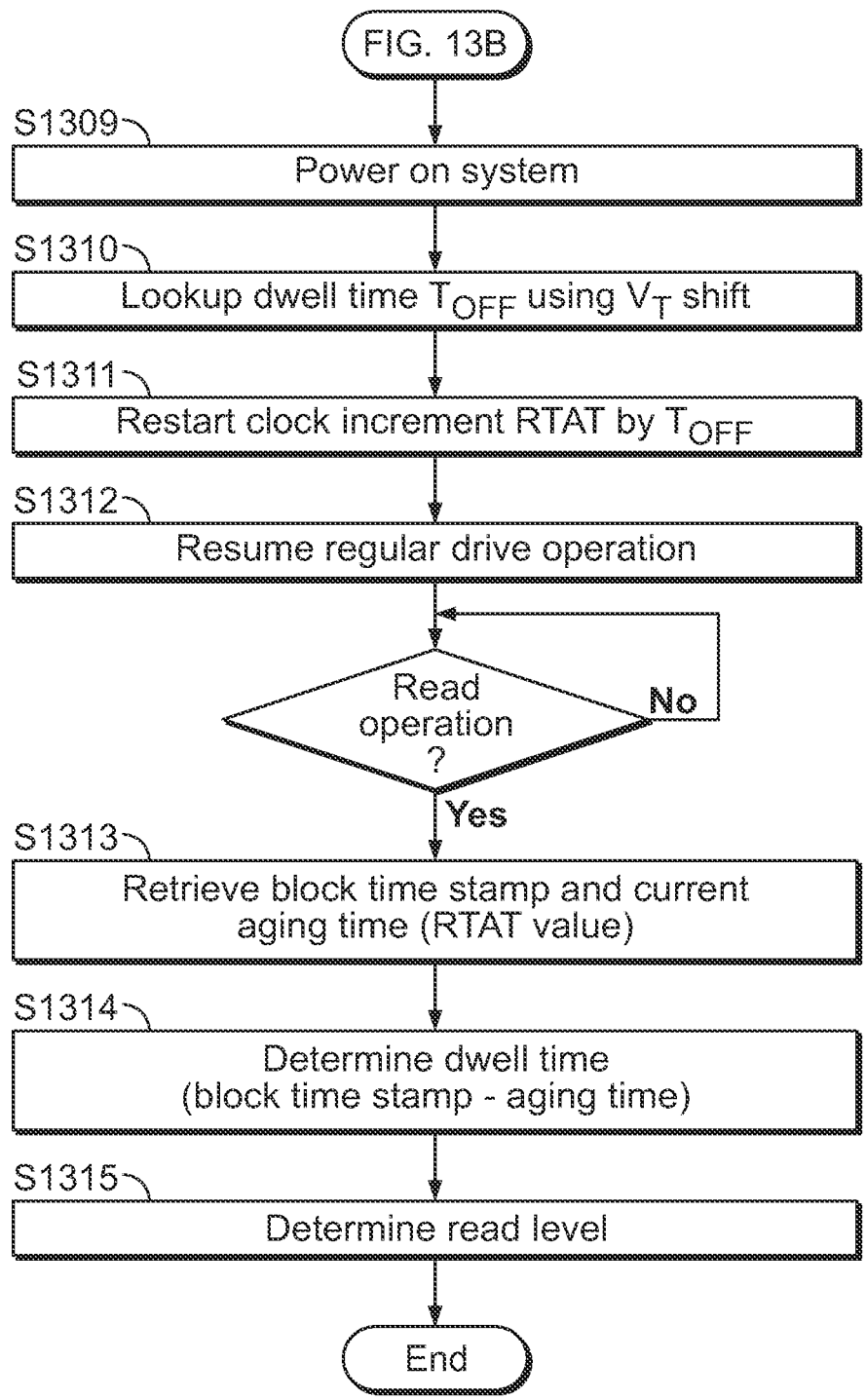

Alternatively, storage device 100 may be configured to continuously track the current temperature 109 of storage device 100 and automatically account for temperature fluctuations. In this aspect, 16 bits are used for each block to store the BTS corrected by a temperature factor. FIGS. 13A to 13C are flowcharts illustrating an alternative process for determining a dwell time for each block in a memory circuit after a shutdown of the memory circuit according to one aspect of the subject technology. Steps S1301 to S1304 illustrate a continuous process for determining a value of time adjusted by temperature. In step S1301 (FIG. 13A), a Time Value (for example, a free running timer or system clock) is continuously incremented while storage system 100 is operational. In step S1302, controller 101 periodically determines if the current temperature (for example, at sensor 109) has changed more than a predetermined amount (for example, ±5 C.), otherwise the process proceeds to step S1304. If the temperature has changed more than the predetermined amount, then, in step S1303, controller 101 determines and/or updates a temperature acceleration factor $AF_{T(Temp-Ref=>Temp-Curr)}$ (Arrhenius equation) to model the dwell time acceleration between current temperature and Reference Temperature (for example, 75 C.).

The $AF_T$ factor provides for the effect of temperature on the dwell time of the memory blocks (for example, high temperatures may have the effect of accelerating time). In some aspects, $AF_{T(Temp-Ref=>Temp-Curr)}$ may be represented by a number ranging from 1 to 171 (8 bits) to account for the time acceleration factor between 55 C. to 105 C., or a number from 1 to 8586 (14 bits) to account for the time acceleration factor between 25 C. and 105 C. (see Table 6, below).

in step S1313, controller 101 retrieves the BTS from the block being read and the current RTAT value. In step S1314, controller 101 determines the total dwell time for the block by subtracting the BTS from the current RTAT value. Controller 101 then, in step S1315, determines the read level in accordance with the procedure described previously in FIG. 6.

Figure 14:
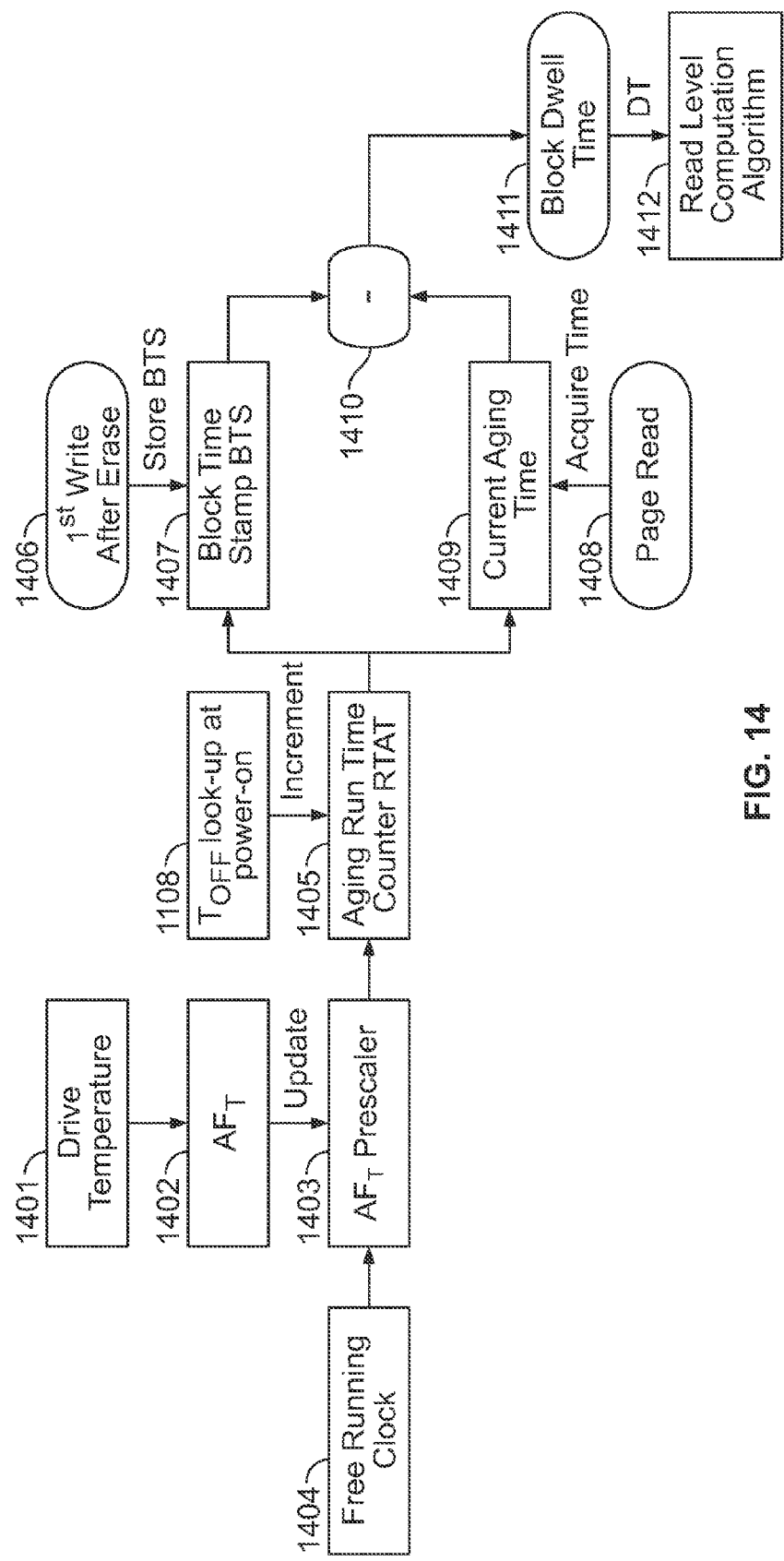
FIG. 14 is a block state diagram illustrating an alternative process for determining a dwell time for each block in a memory circuit after a shutdown of the memory circuit according to one aspect of the subject technology.

FIG. 14 is a block state diagram illustrating an alternative process for determining a dwell time for each block in a memory circuit after a shutdown of the memory circuit according to one aspect of the subject technology. As described previously, internal temperature sensor 109 provides a drive temperature 1401 which is dynamically converted using Arrhenius equation at a Reference Temperature (for example, 75 C.) to generate temperature acceleration factor 1402 $AF_{T(Temp-Ref=>Temp-Curr)}$ (see step 1302) for input to a prescaler 1403. In some aspects, $AF_{T(Temp-Ref=>Temp-Curr)}$ is determined periodically (for example, every 5 minutes). Prescaler 1403 receives temperature conversion factor 1402

TABLE 6

Lookup Table for Arrhenius Equation Factors $AF_T$ For Typical Drive Temperature

| | Temp [C.] | | | | | | | | | | | | | | | | |
|---|---|---|---|---|---|---|---|---|---|---|---|---|---|---|---|---|---|
| | 25 | 30 | 35 | 40 | 45 | 50 | 55 | 60 | 65 | 70 | 75 | 80 | 85 | 90 | 95 | 100 | 105 |
| $AF_T$ | 0.002 x | 0.004 x | 0.009 x | 0.017 x | 0.032 x | 0.059 x | 0.11 x | 0.19 x | 0.34 x | 0.59 x | 1 x | 1.7 x | 2.8 x | 4.5 x | 7.3 x | 11.7 x | 18.3 x |
| Temp Range 55->105 | | | | | | | 1 x | | | | | | | | | | 171 x |
| Temp Range 25->105 | 1 x | | | | | | | | | | | | | | | | 8586 x |

In one aspect, Table 6 can be implemented as one or more lookup tables (for example, on storage medium 102) to generate $AF_T$. In step S1304, controller 101 determines and/or updates a Reference Temperature Aging Time (RTAT) by multiplying the Time Value by $AF_{T(Temp-Ref=>Temp-Curr)}$. In this manner, RTAT may be representative of the Time Value adjusted by the current temperature.

In step S1305 (FIG. 13B), controller 101 determines whether there has been a write operation. On a write operation, the process moves to step S1306 wherein the RTAT value is saved as the block's BTS. In this regard, RTAT, as the Time Value corrected by $AF_{T(Temp-Ref=>Temp-Curr)}$, generates a 16-bit value (8 bits for a 1× to 256× Dwell Time range, and 8 bits for a 55 C. to 105 C. temperature range), or a 22-bit value (8 bits for a 1× to 256× Dwell Time range, and 14 bits for a 25 C. to 105 C. temperature range). Alternatively, controller 101 may save the Time Value or the RTAT value into the first 8 bits and $AF_{T(Temp-Ref=>Temp-Curr)}$ into the second 8 or 14 bits. As illustrated by step S1307, storage system 100 may receive a signal to power off the system. When storage system 100 receives a signal to power off controller 101, in step S1308, controller 101 stops the clock and RTAT freezes until the system is powered on.

In step S1309 (FIG. 13C), storage system 100 receives a signal to power on the system. Similar to the previously described process of FIG. 12 (steps 1201 through 1208), the power-off dwell time 1108 ($T_{Off}$) is estimated in step S1310. In step S1311, the Time Value is unfrozen and RTAT incremented by $T_{Off}$ to account for the time-temperature while storage system 100 was powered down. In step S1312, normal drive operations resume and read and write operations are accepted. Similar to steps S1301 through S1303, $AF_{T(Temp-Ref=>Temp-Curr)}$ is periodically determined and the Time Value corrected to generate RTAT. On a read operation, and a Free Running Clock 1404 to dynamically determine RTAT and update a RTAT counter 1405. In one aspect, RTAT is determined by multiplying a Time Value obtained from Free Running Clock 1404 by temperature acceleration factor 1402 (see also step S1303). On receiving a signal 1406 representative of a block write operation, controller 101 performs BTS Reset 1008 (see FIG. 10) and the current value of RTAT counter 1405 is stored as the block's BTS 1407 (for example, as a 16-bit valve). At power-off, Free Running Clock 1404 is stopped and RTAT counter 1405 frozen.

At power-on, controller 101 determines a current acceleration factor 1402, Free Running Clock 1404 is restarted, and prescaler 1403 begins updating the RTAT counter 1405. Controller 101 also determines the power-off dwell time ($T_{OFF}$) and increments RTAT counter 1405 (see step S1308). On receiving a signal 1408 representative of a read operation, controller 101 captures a Current Aging Time 1409 from RTAT counter 1405. In one aspect, the block's BTS 1407 is then subtracted 1410 from Current Aging Time 1409 to compute the block's dwell time 1411 at current drive temperature. Controller 101 then uses dwell time 1411 to estimate 1412 a $V_T$ shift and to determine a new read level voltage (see FIG. 6). In one aspect, if controller 101 receives a signal 1406 representative of a block write operation after power-on, BTS 1407 will be updated with the current (incremented) value of RTAT counter 1405 (including $T_{OFF}$).

Choosing memory read levels statically at the beginning of life (BOL) in 2-bit/cell MLC NAND flash devices, results in wide SSD performance variation and limits the number of P/E cycles a memory device can undergo, given the maximum acceptable BER level and the expected retention time. Furthermore, attempting to re-read a memory cell is time consuming and may cause further deterioration in memory cell performance. Contrary to industry practice, in the subject technology, read levels are not fixed apriori. In some aspects, they are predicted and/or dynamically adjusted to conform to deteriorating, and thus moving, threshold voltage distributions as the memory device degrades during cycling and retention. They may further be adjusted to reduce BER. In some aspects, the prediction and/or adjustment occurs during run-time, for example, when the drive is in operation. In some aspects, the adjustment occurs after an inactive period, for example, when the drive is powered-off, and a new read level is estimated as a function of the time and temperature of the inactive period. By dynamically predicting, estimating, and adjusting read levels, for the same level of maximum acceptable BER and the same expected retention time, the subject technology allows a drive to achieve a higher number of P/E cycles than a drive without the subject technology. Similarly, for the same number of P/E cycles and the same expected retention time the subject technology allows the SSD to achieve a lower BER, markedly improving SSD performance throughout the lifetime of the drive.

It should be understood that in all cases data may not always be the result of a command received from host 104 and/or returned to host 104. In some aspects, Controller 101 may be configured to execute a read operation independent of host 104 (for example, to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A non-transitory machine-readable medium including machine-executable instructions stored thereon, which when executed by a machine or computer cause the machine or computer to perform a method of determining a dwell time in a memory circuit after a shutdown of the memory circuit, the method comprising:
   storing a first test block before the shutdown;
   storing a second test block after powering on the memory circuit;
   performing a first read level sweep of the first test block to determine a first read level voltage with minimum errors, including determining the first read level voltage as a function of a nominal read level voltage and a first estimation parameter;

performing a second read level sweep of the second test block to determine a second read level voltage with minimum errors, including determining the second read level voltage as a function of the nominal read level voltage and a second estimation parameter;

determining a shutdown threshold voltage ($V_T$) shift as a function of the first read level voltage and the second read level voltage; and determining a shutdown duration as a function of the shutdown $V_T$ shift.

2. The non-transitory machine-readable medium of claim 1, the method further comprising:

reading a drive temperature after the drive temperature has stabilized;

determining a revised duration as a function of the shutdown duration and the drive temperature and a reference temperature; and determining the dwell time as a function of a current time and a block time stamp and the revised duration.

3. The non-transitory machine-readable medium of claim 2, wherein determining the revised duration as a function of the shutdown duration and the drive temperature and the reference temperature includes:

determining a temperature acceleration factor as a function of the drive temperature and the reference temperature; and determining the revised duration as a function of the shutdown duration and the temperature acceleration factor.

4. The non-transitory machine-readable medium of claim 2, the method further comprising:

storing a pre-shutdown temperature before the shutdown, wherein determining the dwell time as a function of the current time and the block time stamp and the revised duration includes:

retrieving the pre-shutdown temperature and the block time stamp after the memory circuit is powered on, determining a temperature acceleration factor as a function of the drive temperature and the pre-shutdown temperature, and determining the dwell time as a function of the current time, the block time stamp, the revised duration, and the temperature acceleration factor.

5. The non-transitory machine-readable medium of claim 4, wherein determining the dwell time includes:

determining a temporary duration by subtracting the block time stamp from the current time; and multiplying the temporary duration by the temperature acceleration factor and then adding the revised duration.

6. The non-transitory machine-readable medium of claim 1, wherein determining a shutdown duration as a function of the shutdown $V_T$ shift includes indexing a lookup table by the shutdown $V_T$ shift and a program/erase cycle to retrieve the shutdown duration.

7. The non-transitory machine-readable medium of claim 1, the method further comprising:

determining the dwell time as a function of a current time and a first block time stamp associated with a memory block and a temperature acceleration factor;

determining an updated block time stamp by subtracting the dwell time from a current time; and storing the updated block time stamp.

8. The non-transitory machine readable medium of claim 1, wherein storing the first test block includes:

writing data to a memory block; and storing an address of the memory block.

9. The non-transitory machine-readable medium of claim 1, the method further comprising:

determining a temperature acceleration factor as a function of a drive temperature;

determining a current aging time as a function of a current time value and the temperature acceleration factor;

determining an post-shutdown aging time as a function of the current aging time and the shutdown duration;

reading a block time stamp; and determining the dwell time by subtracting the block time stamp from the post-shutdown aging time.

10. The non-transitory machine-readable medium of claim 1, the method further comprising:

determining a temperature acceleration factor as a function of a drive temperature;

determining a current aging time as a function of a current time value and the temperature acceleration factor;

receiving a command representative of a write operation; and on receiving the command, storing the aging time as a block time stamp.

11. A control circuit for determining a dwell time in a memory circuit after a shutdown of the memory circuit, comprising:

a memory interface configured to be operably coupled to the memory circuit; and a controller, wherein the controller is configured to:

store a first test block before the shutdown;

save a second test block after the memory circuit is powered on;

perform a first read level sweep of the first test block to determine a first read level voltage with minimum errors, including determining the first read level voltage as a function of a nominal read level voltage and a first estimation parameter;

perform a second read level sweep of the second test block to determine a second read level voltage with minimum errors, including determining the second read level voltage as a function of the nominal read level voltage and a second estimation parameter;

calculate a shutdown threshold voltage ($V_T$) shift as a function of the first read level voltage and the second read level voltage; and calculate a shutdown duration as a function of the shutdown $V_T$ shift.

12. The control circuit of claim 11, wherein the controller is further configured to:

read a drive temperature after the drive temperature has stabilized;

calculate a revised duration as a function of the shutdown duration and the drive temperature and a reference temperature; and calculate the dwell time as a function of a current time and a block time stamp and the revised duration.

13. The control circuit of claim 12, wherein the controller being configured to calculate the revised duration as a function of the shutdown duration and the drive temperature and the reference temperature includes the controller being configured to:

calculate a temperature acceleration factor as a function of the drive temperature and the reference temperature; and calculate the revised duration as a function of the shutdown duration and the temperature acceleration factor.

14. The control circuit of claim 12, wherein the controller is further configured to:

store a pre-shutdown temperature before the shutdown, wherein the controller being configured to calculate the dwell time as a function of the current time and the block time stamp and the revised duration includes the controller being configured to:
retrieve the pre-shutdown temperature and the block time stamp after the memory circuit is powered on,
calculate a temperature acceleration factor as a function of the drive temperature and the pre-shutdown temperature, and
calculate the dwell time as a function of the current time, the block time stamp, the revised duration, and the temperature acceleration factor.

15. The control circuit of claim 14, wherein the controller being configured to calculate the dwell time includes the controller being configured to:
calculate a temporary duration by subtracting the block time stamp from the current time; and
multiply the temporary duration by the temperature acceleration factor and then add the revised duration.

16. The control circuit of claim 11, wherein the controller being configured to calculate a shutdown duration as a function of the shutdown $V_T$ shift includes the controller being configured to index a lookup table by the shutdown $V_T$ shift and a program/erase cycle to retrieve the shutdown duration.

17. The control circuit of claim 11, wherein the controller is further configured to:
calculate the dwell time as a function of a current time and a first block time stamp associated with a memory block and a temperature acceleration factor;
calculate an updated block time stamp by subtracting the dwell time from a current time; and
store the updated block time stamp.

18. The control circuit of claim 11, wherein the controller being configured to store the first test block includes the controller being configured to:
write data to a memory block; and
store an address of the memory block.

19. The control circuit of claim 11, wherein the controller is further configured to:
calculate a temperature acceleration factor as a function of a drive temperature;
calculate a current aging time as a function of a current time value and the temperature acceleration factor;
calculate an post-shutdown aging time as a function of the current aging time and the shutdown duration;
read a block time stamp; and
calculate the dwell time by subtracting the block time stamp from the post-shutdown aging time.

20. The control circuit of claim 11, wherein the controller is further configured to:
calculate a temperature acceleration factor as a function of a drive temperature;
calculate a current aging time as a function of a current time value and the temperature acceleration factor;
receive a command representative of a write operation; and
on receiving the command, store the aging time as a block time stamp.

21. A system for determining a dwell time in a memory circuit after a shutdown of the memory circuit, comprising:
a host interface configured to be operably coupled to a host device, to receive data from the host device, and to send data to the host device;
a temperature sensor;
a storage medium interface operably coupled to a volatile memory;
a memory interface operably coupled to the memory circuit; and
a controller operably coupled to the host interface, wherein the controller is operable to:
store a first test block on the memory circuit before the shutdown;
store a second test block on the memory circuit after the memory circuit is powered on;
perform a first read level sweep of the first test block to determine a first read level voltage with minimum errors, including determining the first read level voltage as a function of a nominal read level voltage and a first estimation parameter;
perform a second read level sweep of the second test block to determine a second read level voltage with minimum errors, including determining the second read level voltage as a function of the nominal read level voltage and a second estimation parameter;
calculate a shutdown $V_T$ shift as a function of the first read level voltage and the second read level voltage; and
calculate a shutdown duration as a function of the shutdown $V_T$ shift.

22. The system of claim 21, wherein the controller is further configured to:
store a pre-shutdown temperature received from the temperature sensor before the shutdown;
read from the temperature sensor a drive temperature after the memory circuit is powered on and after the drive temperature has stabilized;
calculate a revised duration as a function of the shutdown duration and the drive temperature and a reference temperature; and
calculate the dwell time as a function of a current time and a block time stamp and the revised duration.

23. The system of claim 21, wherein the controller is further configured to:
calculate a temperature acceleration factor as a function of a drive temperature;
calculate a current aging time as a function of a current time value and the temperature acceleration factor;
calculate an post-shutdown aging time as a function of the current aging time and the shutdown duration;
read a block time stamp; and
calculate the dwell time by subtracting the block time stamp from the post-shutdown aging time.

\* \* \* \* \*